US006777697B2

(12) United States Patent
Yui et al.

(10) Patent No.: US 6,777,697 B2
(45) Date of Patent: *Aug. 17, 2004

(54) CHARGED-PARTICLE BEAM EXPOSURE APPARATUS AND DEVICE MANUFACTURING METHOD USING THE SAME

(75) Inventors: Yoshikiyo Yui, Utsunomiya (JP); Masato Muraki, Inagi (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 71 days.

(21) Appl. No.: 09/533,217

(22) Filed: Mar. 23, 2000

(65) Prior Publication Data

US 2003/0094584 A1 May 22, 2003

(30) Foreign Application Priority Data

Mar. 25, 1999 (JP) .......................................... 11-081448

(51) Int. Cl.[7] .............................................. H01J 37/302
(52) U.S. Cl. ................................................. 250/492.22
(58) Field of Search ........................ 250/492.22, 492.2, 250/398

(56) References Cited

U.S. PATENT DOCUMENTS 4,362,942 A * 12/1982 Yasuda ..................... 250/492.2
4,531,191 A * 7/1985 Koyama ................... 250/492.2
5,124,560 A * 6/1992 Fueki ....................... 250/492.2
5,384,466 A * 1/1995 Nakamura et al. ...... 250/492.22
5,834,783 A * 11/1998 Muraki et al. .............. 250/398

FOREIGN PATENT DOCUMENTS

| JP | 07-263299 | 10/1995 |
| JP | 08-153657 | 6/1996 |
| JP | 11-026349 | 1/1999 |

* cited by examiner

Primary Examiner—Jack Berman
(74) Attorney, Agent, or Firm—Fitzpatrick, Cella, Harper & Scinto

(57) ABSTRACT

An exposure apparatus for drawing a pattern on a wafer using an electron beam includes a plurality of driving elements for drawing the pattern on the wafer while scanning the wafer with a charged-particle beam, a plurality of driving data memories for storing a plurality of time-series driving data strings for driving the plurality of driving elements, each driving data memory sequentially supplying data forming the time-series driving data string from the first data to a corresponding driving element in accordance with an operation command, and a clock pattern memory for storing a plurality of operation command data strings obtained by aligning operation commands and non-operation commands in time-series, the operation commands and the non-operation commands constituting each operation command data string being sequentially supplied from the first operation command data to a corresponding driving data memory in accordance with a drawing sync clock supplied to the clock pattern memory.

25 Claims, 28 Drawing Sheets

F I G. 1
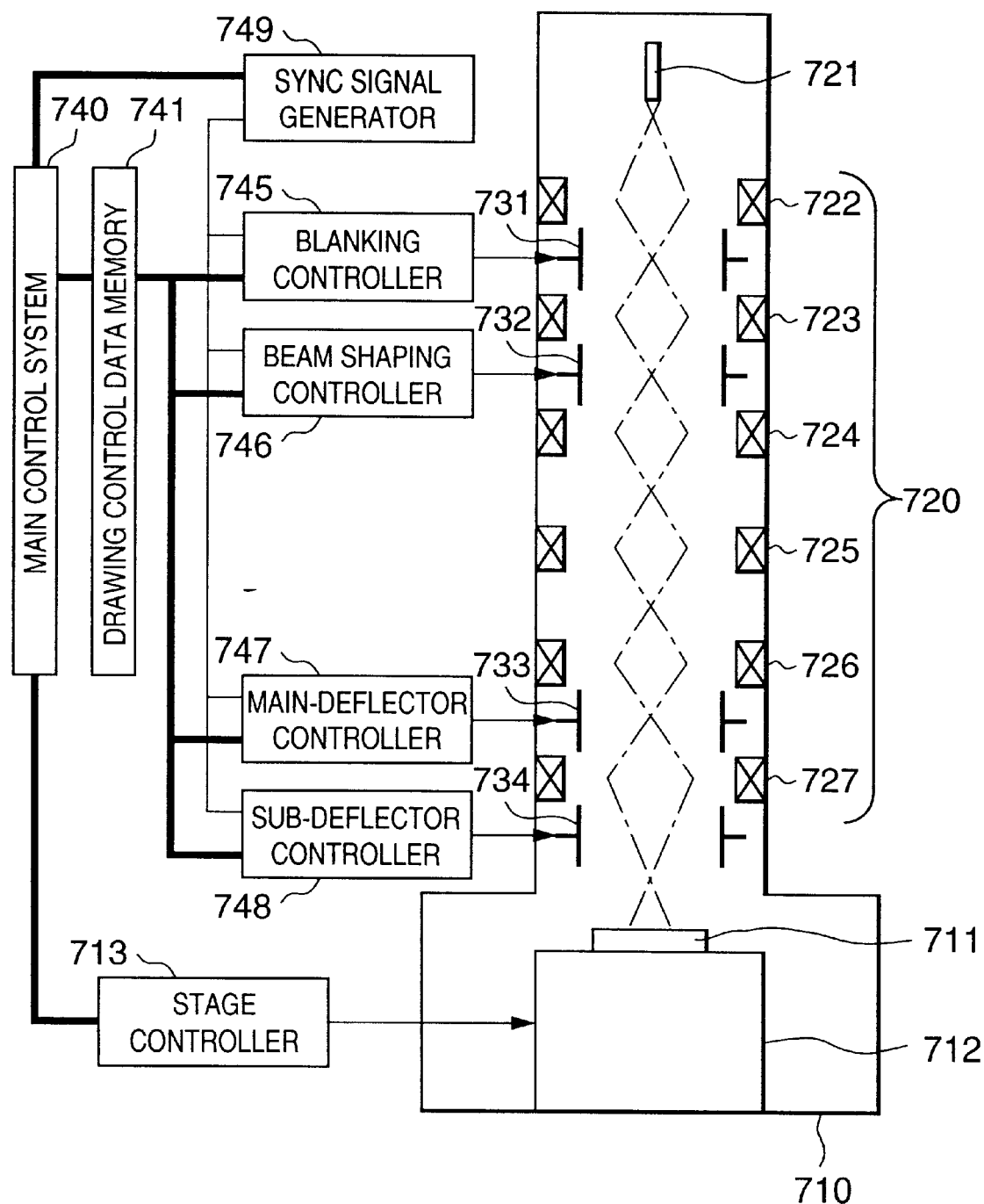

FIG. 8
133 INTERMEDIATE ELECTRODE OF FIRST UNIPOTENTIAL LENS
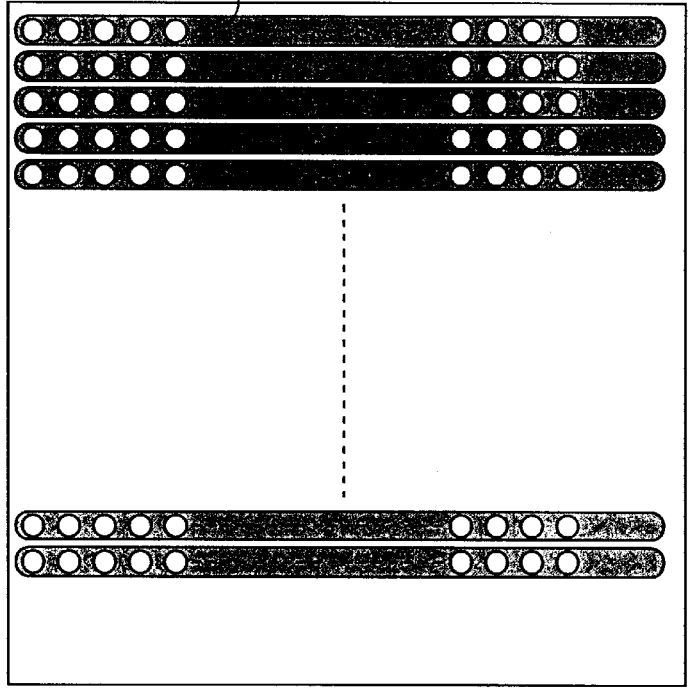
134 INTERMEDIATE ELECTRODE OF SECOND UNIPOTENTIAL LENS
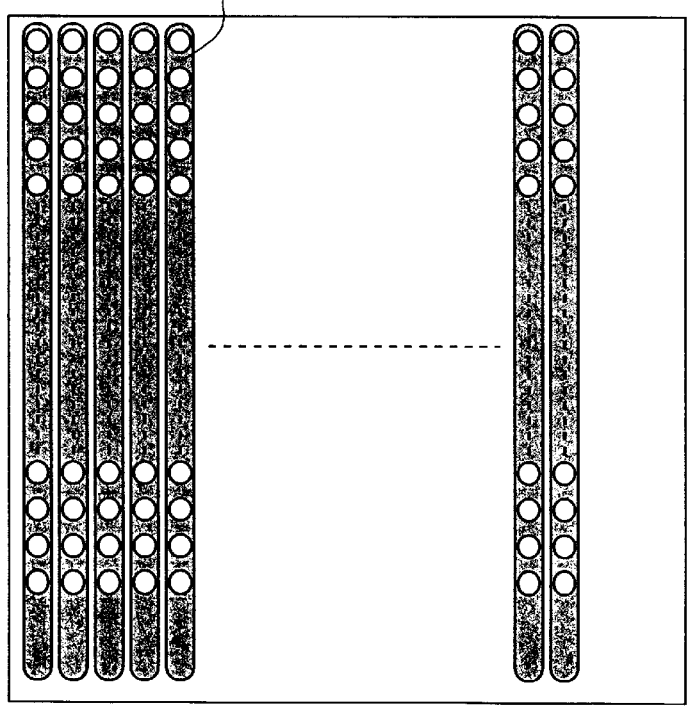

CHARGED-PARTICLE BEAM EXPOSURE APPARATUS AND DEVICE MANUFACTURING METHOD USING THE SAME

FIELD OF THE INVENTION

The present invention relates to a charged-particle beam exposure apparatus such as an electron beam exposure apparatus or ion beam exposure apparatus mainly used to manufacture a semiconductor integrated circuit, mask, and the like and, more particularly, to a charged-particle beam exposure apparatus for drawing a pattern using a charged-particle beam, and a device manufacturing method using the same.

BACKGROUND OF THE INVENTION

FIG. 1 is a view showing the schematic arrangement of an electron beam exposure apparatus as an example of a conventional charged-particle beam exposure apparatus. In FIG. 1, reference numeral 710 denotes a work chamber which incorporates an X-Y stage 712 holding a sample 711 such as a semiconductor wafer or a glass mask material. The X-Y stage 712 is driven by an X-Y stage controller 713 in the X direction (right and left with respect to the sheet surface of FIG. 1) and the Y direction (back and forth with respect to the sheet surface of FIG. 1).

An electron beam optical system 720 is arranged above in the work chamber 710. The optical system 720 is comprised of an electron gun 721, various lenses 722 to 727, a blanking deflector 731, a deflector 732 for changing the beam size, a main deflector 733 for scanning a beam, a sub-deflector 734 for scanning a beam, a beam shaping aperture, and the like. The main deflector 733 positions a beam to a predetermined sub-deflection region (subfield), and the sub-deflector 734 positions a figure drawing position in the subfield. At the same time, the deflector 732 and shaping aperture control the beam shape. While the X-Y stage 712 is continuously moved in one direction, drawing processing is done for a drawing stripe region (region within a range drawable by one continuous movement of the X-Y stage 712). Every time one continuous movement of the X-Y stage 712 ends, the X-Y stage 712 is moved stepwise in a direction perpendicular to the continuous movement direction. This processing is repeated to sequentially perform drawing processing for respective drawing stripe regions.

A main control system 740 outputs drawing control data for each stripe that is stored in a drawing control data memory 741 to a blanking controller 745, beam shaping controller 746, main-deflector controller 747, and sub-deflector controller 748. Each controller controls a control object on the basis of the drawing control data in synchronism with a sync signal from a sync signal generator 749.

More specifically, the main-deflector controller 747 supplies a predetermined deflection signal to the main deflector 733 of the optical system 720 in synchronism with a sync signal from the sync signal generator 749. Then, the electron beam is deflected to scan a designated subfield position. A predetermined time after the main-deflector controller 747 receives the sync signal, the main-deflector controller 747 outputs to the blanking controller 745, beam shaping controller 746, and sub-deflector controller 748 an enable signal representing that the electron beam is settled in the designated position to enable exposure. At the same time, the sub-deflector controller 748 receives a sync signal from the sync signal generator 749, and supplies a predetermined sub-deflection signal to the sub-deflector 734 in synchronism with the sync signal. The beam shaping controller 746 supplies a predetermined deflection signal to the deflector 732 to control the size of the electron beam. The blanking controller 745 supplies a predetermined deflection signal to the blanking deflector 731 to control irradiation of the electron beam. Accordingly, drawing processing is done in units of subfields.

Letting a settling time be a time required for the control object of the control system to reach a target value, the settling time of an electron beam deflected by the main deflector 733 changes depending on the deflection amount. In the prior art, the maximum settling time required to settle an electron beam deflected by the main deflector 733 is regarded as an electron beam settling time in all the deflection amounts, and each controller is controlled using this settling time as a reference (fixed settling time). That is, the fixed settling time after the main-deflector controller 747 receives a sync signal, the main-deflector controller outputs to each controller an exposure enable signal representing that the electron beam is settled in a target position to enable exposure. Depending on the deflection amount of the main deflector 733, a wasteful standby time is set to decrease the productivity of the electron beam exposure apparatus. Further, an actual exposure apparatus comprises a plurality of controllers for controlling deflection of the electron beam for respective subfield exposure processes. In addition, the settling time of an electron beam deflected under the control of each controller changes depending on a preceding state. For this reason, the longest settling time is set as a standby time. As a result, the productivity further decreases.

SUMMARY OF THE INVENTION

The present invention has been made in consideration of the above situation, and has as its object to determine a proper settling time for each operation and reduce an unnecessary standby time, thereby obtaining high throughput.

A charged-particle beam exposure apparatus according to the present invention for drawing a pattern on an object to be exposed using a charged-particle beam, comprises a plurality of driving elements for drawing the pattern on the object while scanning the object with the charged-particle beam, a plurality of driving data memories for storing a plurality of time-series driving data strings for driving said plurality of driving elements, each driving data memory sequentially supplying data forming the time-series driving data string from first data to a corresponding driving element in accordance with an operation command, and a pattern memory for storing a plurality of operation command data strings obtained by aligning operation commands and non-operation commands in time-series, the operation commands and the non-operation commands constituting each operation command data string being sequentially supplied from first operation command data to a corresponding driving data memory in accordance with a control signal supplied to the pattern memory. The charged-particle beam exposure apparatus can achieve high throughput.

The plurality of driving elements may include a plurality of types of driving elements, and/or a deflector for deflecting the charged-particle beam, and/or an irradiation controller for controlling irradiation of the charged-particle beam to the object. The irradiation controller controls whether the object is irradiated with the charged-particle beam and/or an irradiation time of the charged-particle beam to the object.

Alternatively, the plurality of driving elements may include a first deflector for deflecting the charged-particle beam and scanning a subfield of the object with the charged-particle beam, and a second deflector for deflecting the charged-particle beam and changing a subfield to be scanned.

Alternatively, the charged-particle beam exposure apparatus may further comprise a charged-particle beam source, and an electrooptic system for projecting on the object the charged-particle beam emitted by the source, and the plurality of driving elements may include a focus correction unit for correcting a focal position of the electrooptic system.

Alternatively, the charged-particle beam exposure apparatus may further comprise a source for generating a charged-particle beam, and an electrooptic system for projecting on the object the charged-particle beam emitted by the source, and the plurality of driving elements may include an astigmatism correction unit for correcting astigmatism of the electrooptic system.

Alternatively, the charged-particle beam exposure apparatus may further comprise a source for generating a charged-particle beam, and an electrooptic system for projecting on the object the charged-particle beam emitted by the source, and the plurality of driving elements may include a deflector for deflecting the charged-particle beam, an irradiation controller for controlling irradiation of the charged-particle beam to the object, and an astigmatism correction unit for correcting astigmatism of the electrooptic system.

Alternatively, the plurality of driving data memories may include an irradiation control data memory for storing a driving data string as irradiation control data for driving the driving elements for controlling irradiation of the charged-particle beam, the irradiation control data memory may include a plurality of unit region data memories for storing irradiation control data necessary for drawing in respective unit regions of the object, and the plurality of operation command data strings stored in the pattern memory may include an operation command data string for sequentially selecting the plurality of unit region data memories.

The charged-particle beam apparatus may further comprise a source for generating a plurality of charged-particle beams, and draw a pattern on the object using the plurality of charged-particle beams.

A device manufacturing method according to the present invention comprises the steps of applying a resist film to a substrate, drawing a pattern on the substrate using a charged-particle beam exposure apparatus, and performing developing processing to the substrate, wherein the charged-particle beam exposure apparatus draws a pattern using a charged-particle beam on the substrate, and includes a plurality of driving elements for drawing the pattern on the substrate while scanning the substrate with the charged-particle beam, a plurality of driving data memories for storing a plurality of time-series driving data strings for driving the plurality of driving elements, each driving data memory sequentially supplying data forming the time-series driving data string from first data to a corresponding driving element in accordance with an operation command, and a pattern memory for storing a plurality of operation command data strings obtained by aligning operation commands and the non-operation commands in time-series, the operation commands and non-operation commands constituting each operation command data string being sequentially supplied from first operation command data to a corresponding driving data memory in accordance with a control signal supplied to the pattern memory. The device manufacturing method can achieve high throughput.

Further objects, features and advantages of the present invention will become apparent from the following detailed description of embodiments of the present invention with reference to the accompanying drawings.

BRIEF DESCRIPTION OF THE DRAWINGS

FIG. 1 is a view showing a conventional electron beam drawing apparatus;

FIG. 8 is a plan view showing the intermediate electrode of the unipotential lens in this embodiment;

DETAILED DESCRIPTION OF THE PREFERRED EMBODIMENTS

An embodiment will exemplify an electron beam exposure apparatus as an example of a charged-particle beam exposure apparatus. The present invention can also be applied to an exposure apparatus using not only an electron beam but also an ion beam.

(Arrangement of Electron Beam Exposure Apparatus)

Figure 2:
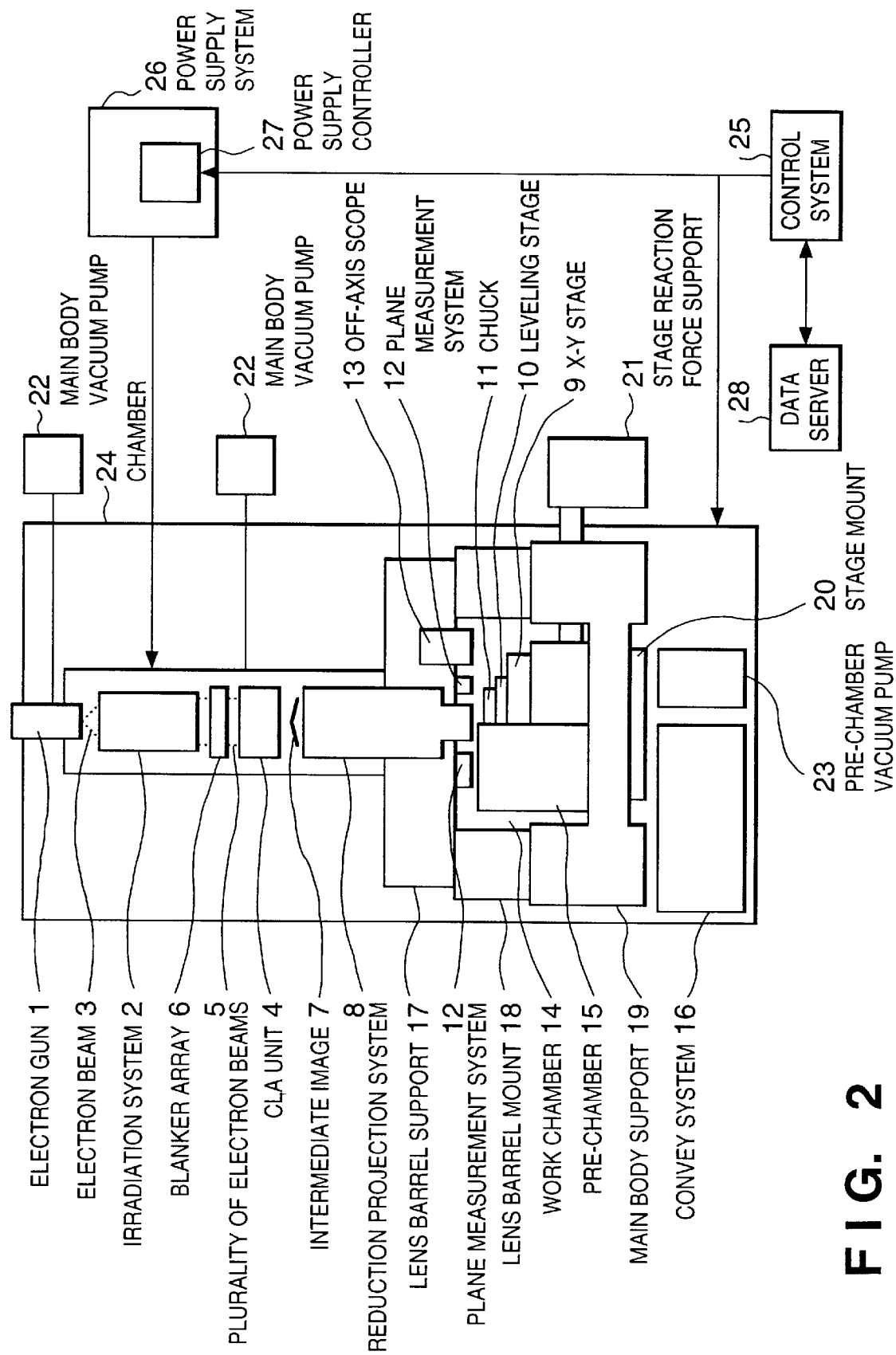
FIG. 2 is a view showing the whole arrangement of an electron beam drawing apparatus according to an embodiment.

FIG. 2 is a view showing the schematic arrangement of an electron beam drawing apparatus according to the present invention. In FIG. 2, reference numeral 1 denotes an electron gun serving as a drawing beam source; 2, an irradiation system for shaping an electron beam 3 emitted by the electron gun 1 into a desired characteristic, and irradiating a sample with the electron beam 3; 4, a CLA unit for generating a plurality of electron beams 5 from the electron beam 3 emitted by the irradiation system 2, and forming an intermediate image 7 so as to decrease the curvature of field on a sample to be exposed to a pattern; and 6, a blanker array which transmits or shields the plurality of electron beams 5. The intermediate image 7 is formed by the CLA unit 4. Reference numeral 8 denotes a reduction projection system for reducing the intermediate image 7 and projecting it onto the sample to draw a desired pattern; 9, an X-Y stage for moving the sample within a plane perpendicular to the optical axis of the reduction projection system 8; 10, a leveling stage for making the exposure surface of the sample match the image plane of the reduction projection system 8; 11, a chuck for chucking the sample; 12, a plane measurement system for measuring the height or tilt of the sample surface on the chuck 11; 13, an off-axis scope for measuring an alignment mark and various correction marks patterned on the sample; 14, a work chamber; and 15, a pre-chamber for exchanging the sample on the chuck 11 and transferring the sample between the apparatus and a convey system 16. The convey system 16 extracts a sample from a carrier or the like, loads the sample to the pre-chamber 15, unloads an exposed sample from the pre-chamber 15, and stores the sample in the carrier or the like. Reference numeral 17 denotes a lens barrel support which supports the electron gun 1, irradiation system 2, CLA unit 4, blanker array 6, reduction projection system 8, plane measurement system 12, and off-axis scope 13; 18, a lens barrel mount for suppressing transfer of external vibrations to the lens barrel support 17; 19, a main body support which supports the lens barrel mount 18 and pre-chamber 15; 20, a stage mount for supporting the X-Y stage 9 and leveling stage 10; 21, a stage reaction force support for supporting the X-Y stage 9 against a driving reaction force; 22, a main body vacuum pump for keeping the interior of the apparatus vacuum; 23, a pre-chamber vacuum pump for evacuating the interior of the pre-chamber 15; 24, a chamber for managing and adjusting the temperature of the whole apparatus and the cooling system of each unit of the apparatus; 25, a control system for controlling the apparatus; 26, a power supply system having a power supply unit for supplying highly stable voltages and currents to the electron gun 1, irradiation system 2, and reduction projection system 8, and a power supply controller 27 for controlling their power supply voltages; and 28, a data server for converting CAD data corresponding to a circuit pattern to be drawn into drawing data processible by the electron beam drawing apparatus.

This arrangement will be explained in more detail.

Figure 3:
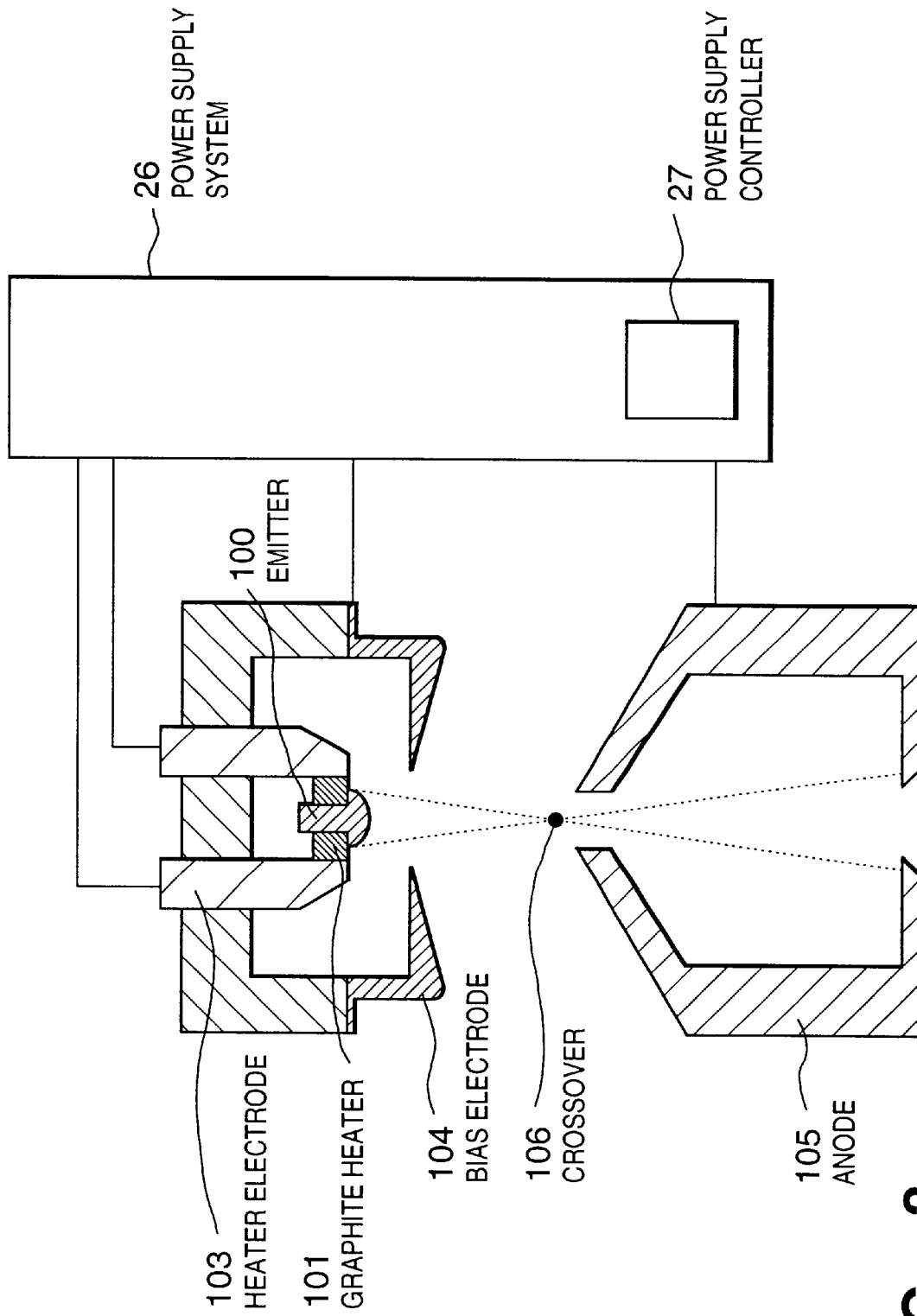
FIG. 3 is a sectional view showing an electron gun in this embodiment in detail.

FIG. 3 is a sectional view showing the electron gun 1 in detail. In FIG. 3, reference numeral 100 denotes an emitter serving as an electron generation source which is formed by cutting out monocrystalline $LaB_6$ (lanthanum hexaboride) into a column shape, and processing the electron-emitting surface into a spherical shape; 101, a graphite heater for energization heating that supplies a current via a heater electrode 103 to keep heating the emitter 100 at a predetermined temperature; 104, a bias electrode for applying a negative voltage with respect to the potential of the emitter 100 to limit an electron generation region and giving a convergent effect to an electric field generated between the bias electrode 104 and the emitter 100; and 105, an anode for receiving a positive voltage with respect to the potential of the emitter 100, extracting electrons from the emitter 100, accelerating the emitted electrons, and forming a crossover 106. In practice, the anode 105 is formed as a ground electrode, and the emitter 100 has a high negative potential with respect to this ground potential. The heater electrode 103 receives power from the power supply system 26, and the heater 101 is driven by a constant current. Similarly, the emitter 100 and bias electrode 104 also receive power from the power supply system 26, and are controlled by the power supply controller 27. The interior of the electron gun is evacuated by the main body vacuum pump 22 and kept in a high vacuum at 10–8 Torr or less.

Figure 4:
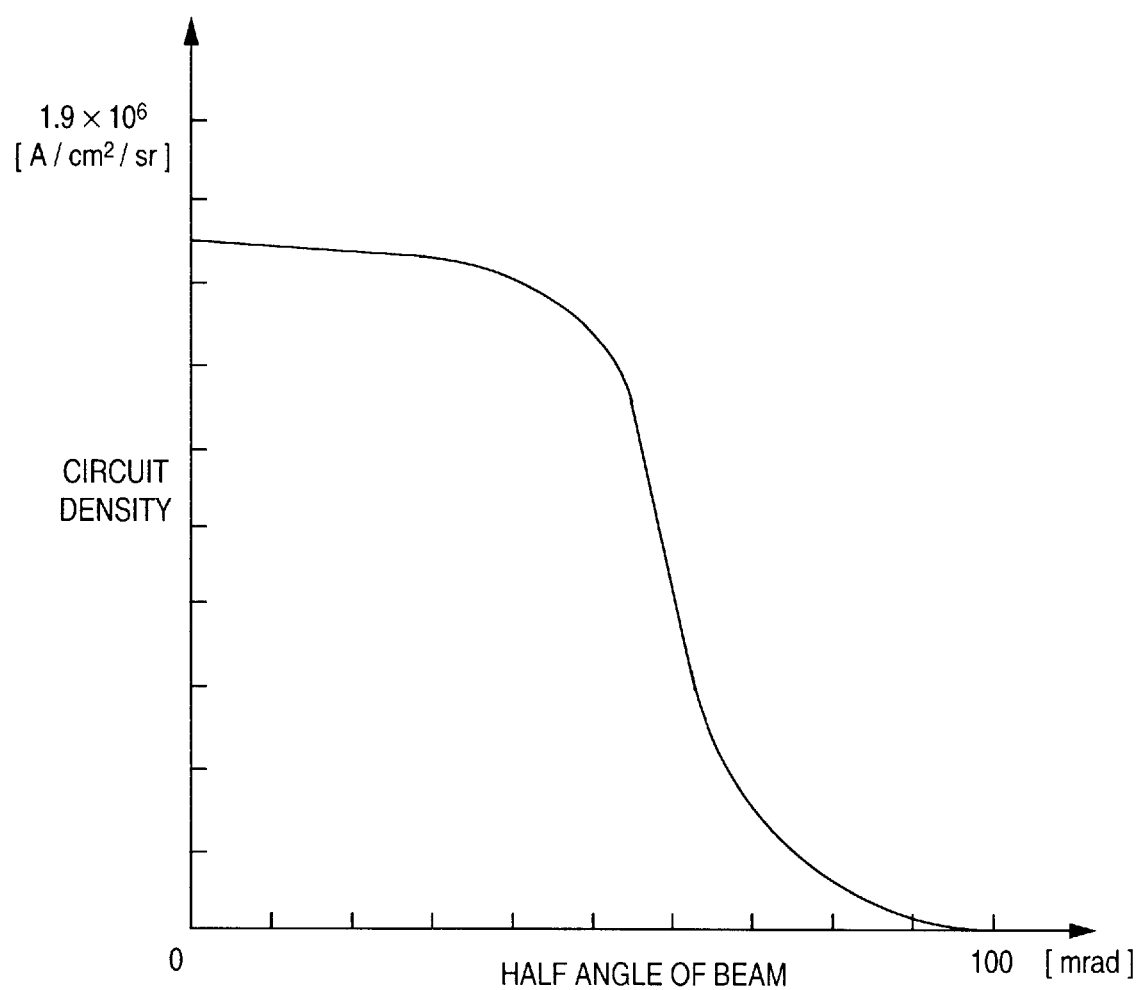
FIG. 4 is a graph showing the angle characteristic of the electron gun in this embodiment.

FIG. 4 is a graph showing a luminance vs. angle characteristic obtained by the electron gun of this embodiment. As is apparent from FIG. 4, the luminance is high over a wide angle, which is a feature of the electron gun according to this embodiment.

Figure 5:
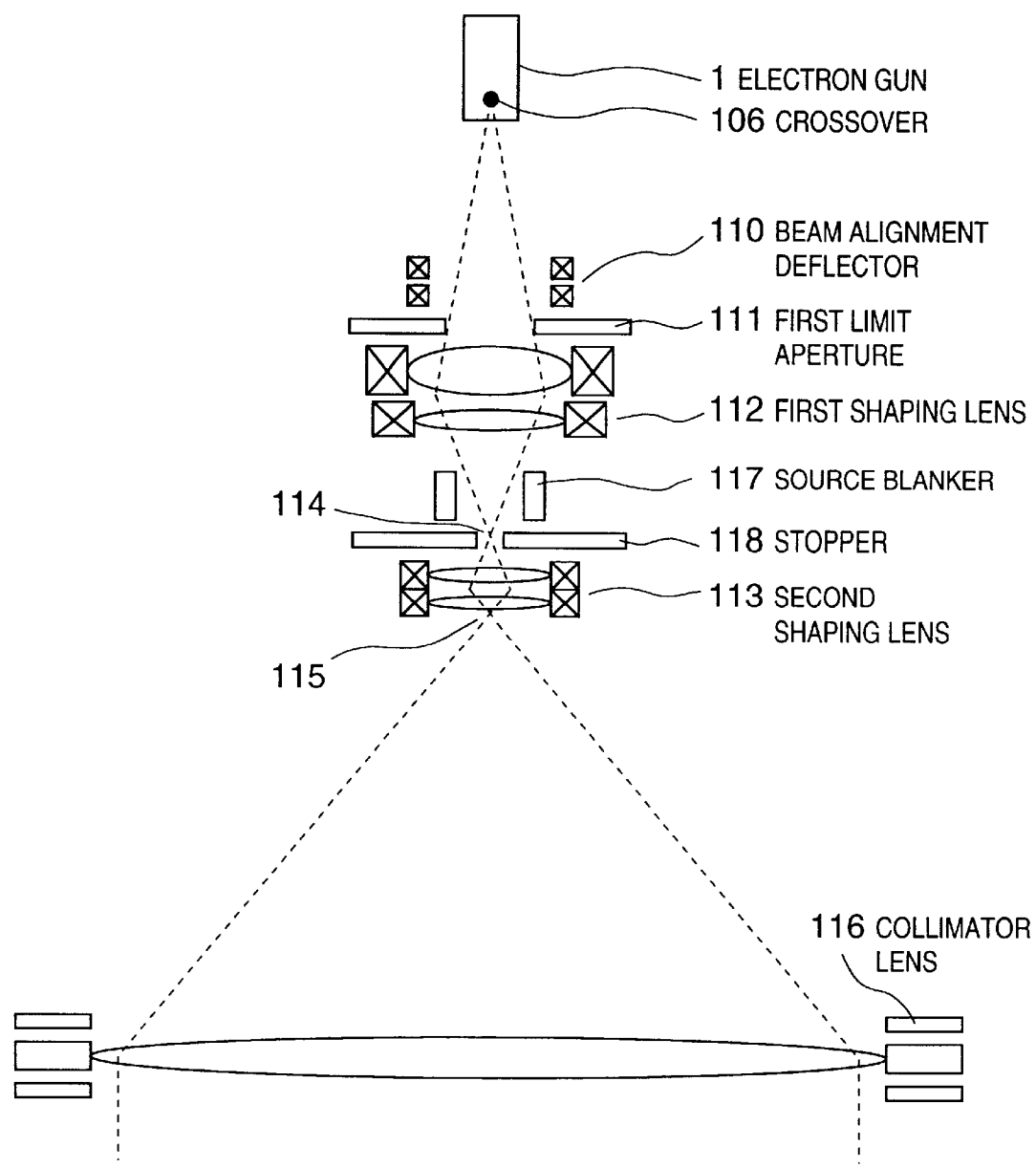
FIG. 5 is a sectional view showing an irradiation system in this embodiment in detail.

FIG. 5 is a sectional view showing the irradiation system 2 in detail. In FIG. 5, reference numeral 110 denotes a beam alignment deflector for adjusting the optical axis position for the electron beam 3 emitted by the electron gun 1 and setting the electron beam to be accurately incident on the electrooptic system. The beam alignment deflector 110 receives power from the power supply system 26, and is controlled by the power supply controller. When emitters are to be exchanged or the optical axis position of the electron beam varies, the beam alignment deflector 110 is adjusted manually or automatically by a command from a control system 25 (to be described later). Reference numeral 111 denotes a first limit aperture for shielding the marginal ray of the electron beam 3 to inhibit unwanted electrons from being incident on the subsequent electrooptic system; and 112 and 113, shaping lenses for shaping the image of the crossover 106 of the electron beam 3 emitted by the electron gun 1. The first shaping lenses 112 form an image 114 of the crossover 106, and the second shaping lenses 113 form an image 115 of the image 114. The first and second shaping lenses 112 and 113 receive power from the power supply system 26, and are controlled to change the focal lengths of the respective lenses. By adjusting these focal lengths, the image 115 of a desired size can be obtained. An electron beam which forms the image 115 of the crossover 106 shaped into a desired size by the shaping lenses is collimated by a collimator lens 116, and is incident on the CLA unit 4. Reference numeral 117 denotes a source blanker which shields the electron beam 3 using a stopper 118 when the electron beam 3 need not be incident on the subsequent electrooptic system.

Figure 6:
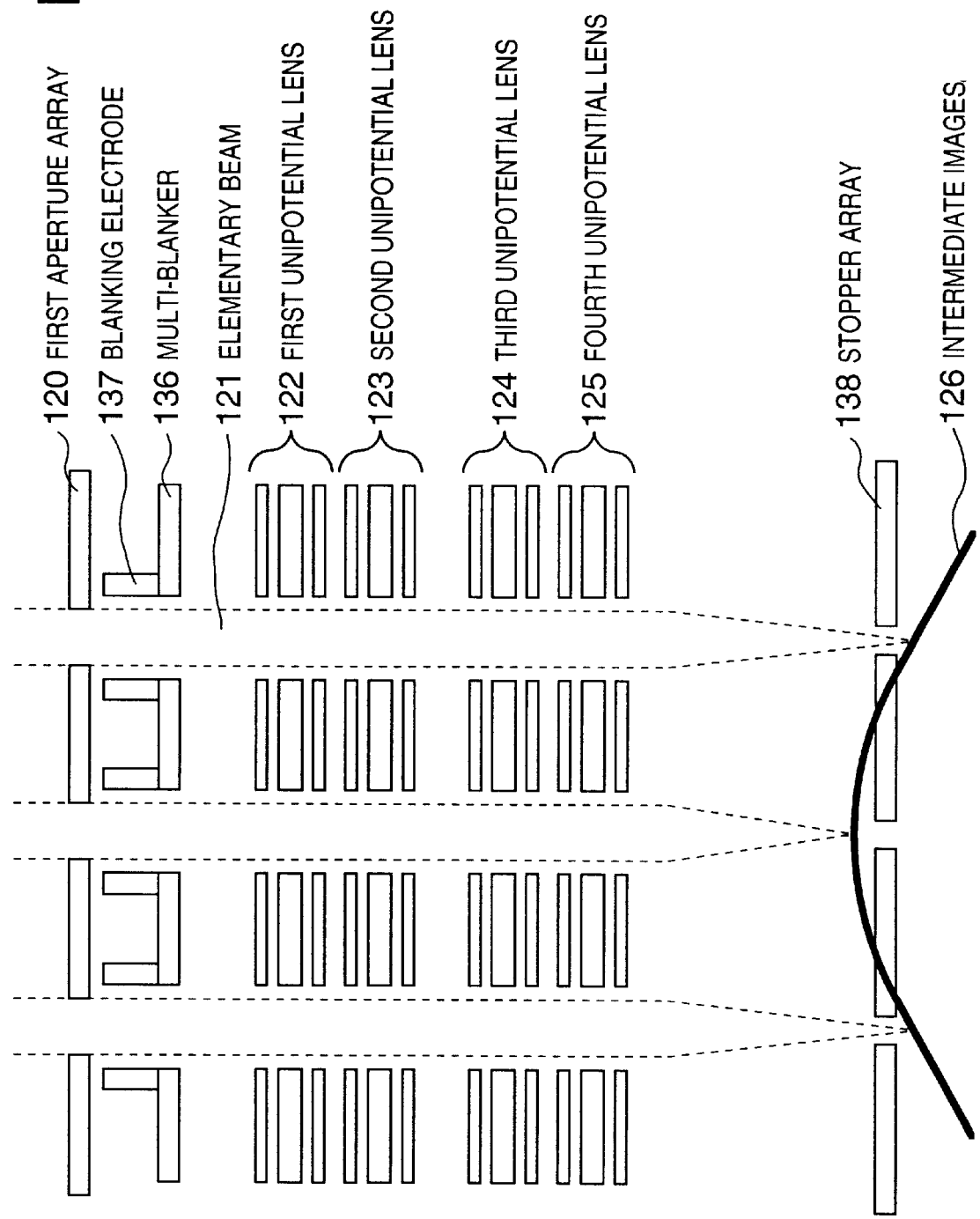
FIG. 6 is a sectional view showing a CLA unit in this embodiment in detail.

FIG. 6 is a sectional view showing the CLA unit 4 and blanker array 6. In FIG. 6, reference numeral 120 denotes a first aperture array which has a plurality of apertures laid out in a 64×64 matrix within a plane perpendicular to the optical axis, and splits the electron beam 3 into a plurality of elementary beams 121. Each split elementary beam 121 is incident on a first unipotential lens 122. The first unipotential lens 122 is a multi-lens array having lenses corresponding to the respective apertures of the first aperture array 120.

These lenses are laid out in a 64×64 matrix within a plane perpendicular to the optical axis, similar to the first aperture array. Second, third, and fourth unipotential lenses 123, 124, and 125 are also multi-lens arrays similar to the first unipotential lens. This embodiment uses the four unipotential lenses to obtain intermediate images 126 corresponding to the respective elementary beams 121. The electron beam drawing apparatus according to the preferred embodiment of the present invention forms the obtained intermediate images 126 by the reduction projection system 8 onto a sample surface to be exposed to a pattern. These images are deflected to draw a desired pattern. Each intermediate image 126 is formed to correct aberrations generated in the reduction projection system 8. The unipotential lenses of this embodiment function to correct the curvature of field among these aberrations at a high precision.

Figure 7:
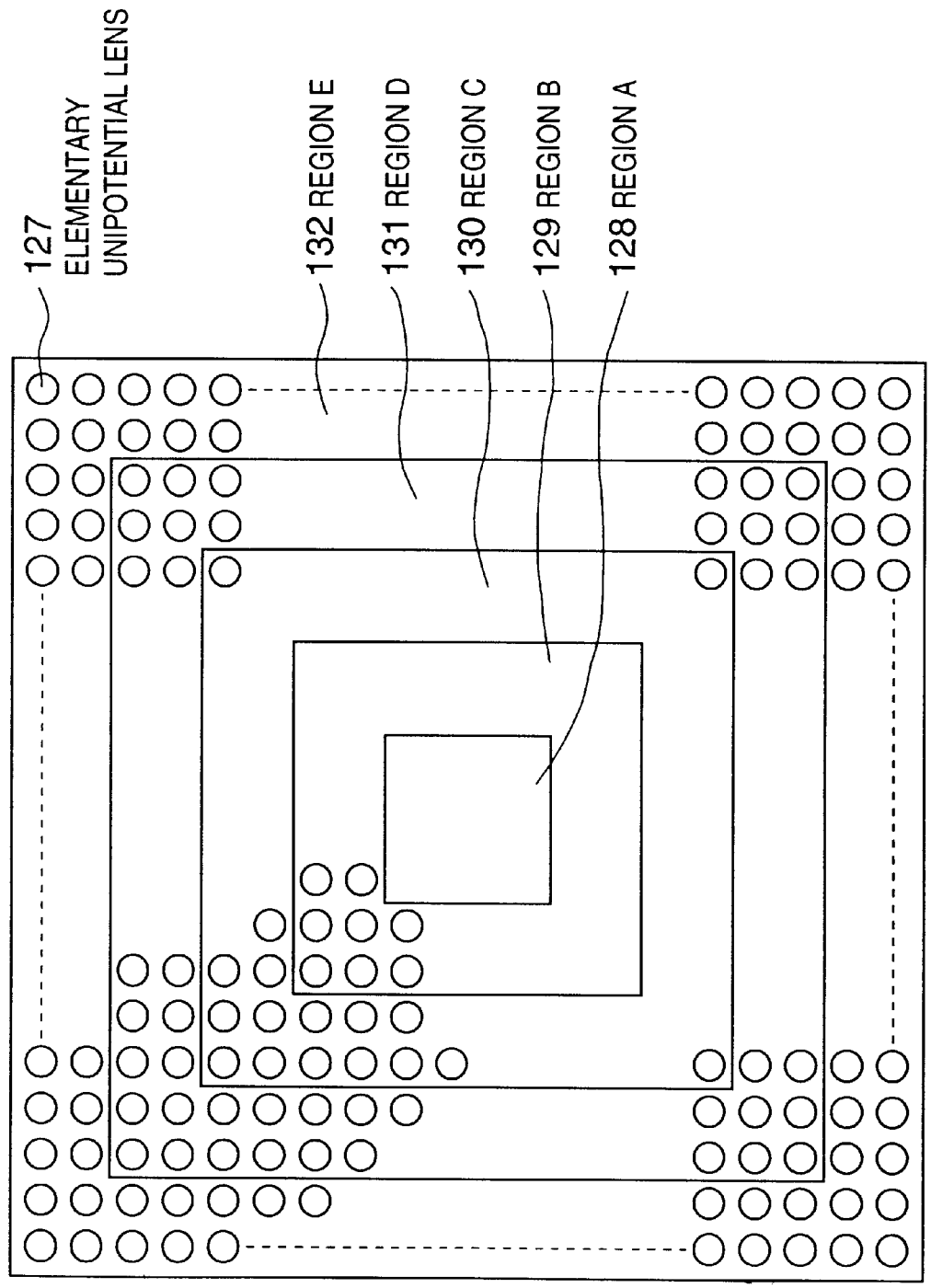
FIG. 7 is a plan view showing an intermediate electrode of a unipotential lens.

FIG. 7 is a plan view of an intermediate electrode showing an example of the first unipotential lens 122. By applying different powers to elementary unipotential lenses 127 laid out in a 64×64 matrix, the imaging positions of the intermediate images of the elementary beams 121 can be arbitrarily set. To form the matrix layout symmetrically about the optical axis of the reduction projection system 8, the matrix layout is divided into, e.g., concentric regions A (128) to E (132). The imaging positions of the intermediate images 126 of the elementary beams 121 are adjusted for the respective regions so as to reduce the curvature of field to a negligible degree on the sample surface at last. The four unipotential lenses are employed in consideration of the manufacturing convenience of the unipotential lens and the stability of the correction function. To realize the same function, another arrangement may be adopted. Each unipotential lens has a three-layered electrode structure. In general, the outer electrode is set to a ground potential, and a middle electrode receives a desired potential. Since the respective elementary unipotential lenses 127 receive different powers, as described above, different voltages are applied to the intermediate electrodes of the elementary unipotential lenses. In externally extracting wires from many intermediate electrodes in manufacturing a multi-lens array, the wires passing near the elementary unipotential lenses disturb the electric field within the elementary unipotential lenses. In some cases, elementary beams cannot be incident on set imaging positions. Considering this, according to the embodiment, the first unipotential lens 122 is divided into regions in the column direction of the matrix layout, and power which is the same in units of rows and symmetrical in the column direction is applied. The second unipotential lens 123 is divided into regions in the row direction, and power which is the same in units of columns and symmetrical in the row direction is applied. The two, first and second unipotential lenses 122 and 123 are combined to form the same intermediate images 126 as those obtained by regions divided symmetrical about the optical axis of the reduction projection system 8. Accordingly, the wiring of the intermediate electrodes of each unipotential lens is simplified to be almost free from the above-described problem. This state is shown in FIG. 8. In FIG. 8, reference numeral 133 denotes intermediate electrodes of the first unipotential lens 122 in which the rows of the matrix layout have a common pattern. In intermediate electrodes 134 of the second unipotential lens 123, the columns of the matrix layout have a common pattern. An actual unipotential lens has a three-layered structure including upper and lower ground electrode layers via each intermediate electrode, as described above.

The first and second unipotential lenses 122 and 123 are combined in this manner. In this embodiment, the third and fourth unipotential lenses 124 and 125 are further combined, and the total of four unipotential lenses are combined. Power distribution is optimized. Voltages applied to intermediate electrodes in each unipotential lens are dynamically adjusted during drawing operation to obtain an optimal image.

Referring back to FIG. 6, reference numerals 136 denote multi-blankers laid out in a 64×64 matrix in correspondence with the first aperture array 120 and the first to fourth unipotential lenses (122 to 125). To individually blank the elementary beams 121, the respective multi-blankers 136 have blanking electrodes 137. Reference numeral 138 denotes a stopper array having apertures corresponding to the apertures of the multi-blankers 136. In blanking, each elementary beam deflected by the multi-blanker 136 is shielded by the stopper array 138. In pattern drawing, each blanking electrode 137 is independently controlled to transmit/shield the elementary beam at an arbitrary drawing timing. At the same time, the ON time is also controlled to control the dose of each elementary beam onto the sample.

Figure 9:
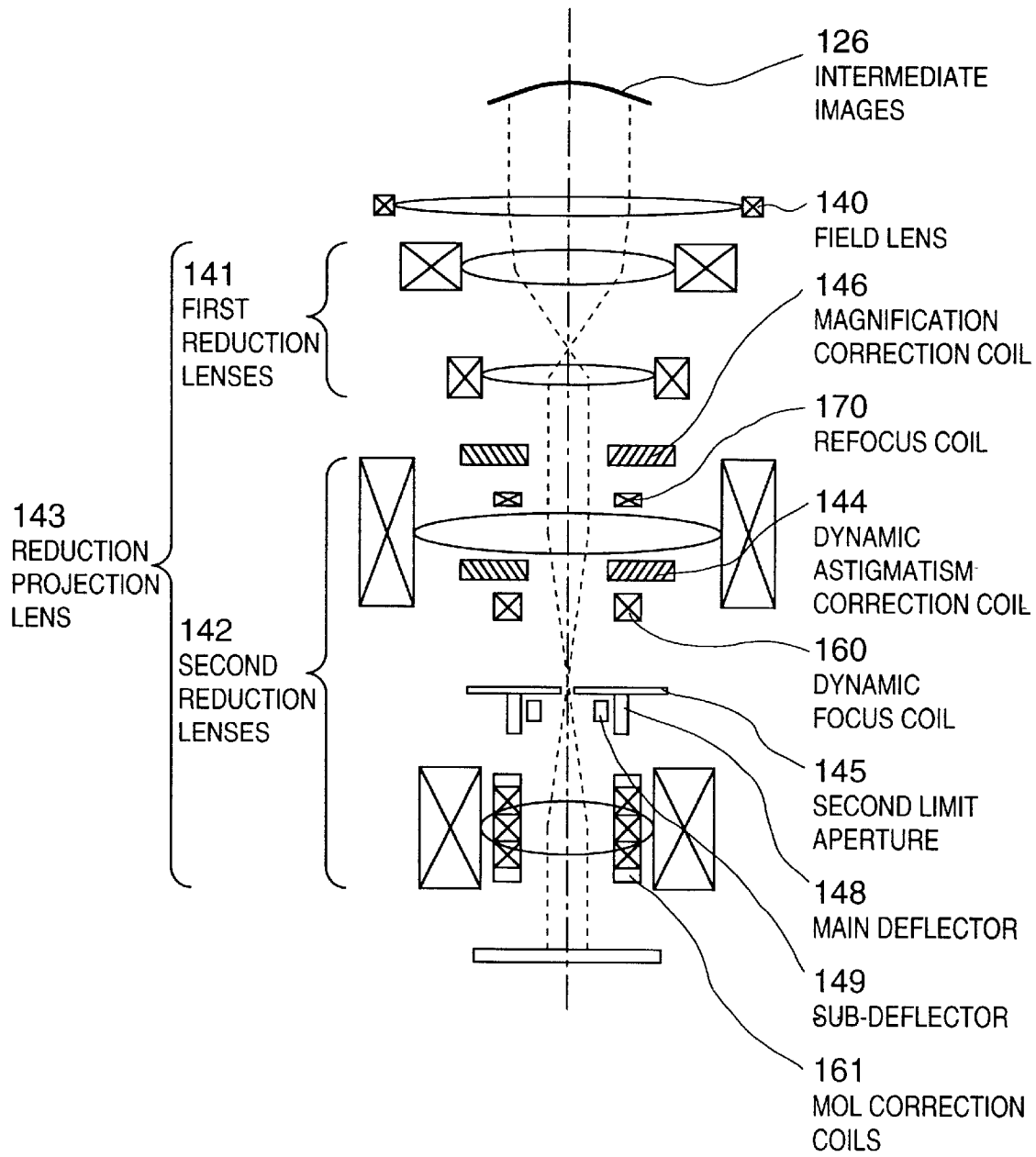
FIG. 9 is a sectional view showing a reduction projection system in this embodiment in detail.

FIG. 9 is a sectional view showing the reduction projection system 8 in detail. In FIG. 9, reference numeral 140 denotes a field lens serving as a fixed-magnification lens whose magnetic field intensity is set to adjust the final projection magnification to a predetermined value; 141, first reduction lenses; and 142, second reduction lenses. These lenses 141 and 142 constitute a reduction projection lens 143. The reduction projection lens 143 projects and forms the intermediate image 126 onto the sample at a ratio of 1/50. Reference numeral 144 denotes a dynamic astigmatism correction coil of an octupole structure having eight magnetic poles facing each other on the circumference around the optical axis. The dynamic astigmatism correction coil 144 mainly corrects astigmatism caused by deflection of a drawing beam by a main deflector 148 (to be described later). Reference numeral 145 denotes a second limit aperture for shielding electrodes unnecessary for pattern drawing. A magnification correction coil 146 is made up of correction coils having the same structure as that of the dynamic astigmatism correction coil 144. Using them, the final imaging magnification of the intermediate image 126 in each direction is adjusted. The main deflector 148 and a sub-deflector 149 scan an image N of the intermediate image 126 on a sample to be exposed to a pattern, and obtain a desired pattern while the X-Y stage 9 is driven.

Figure 10:
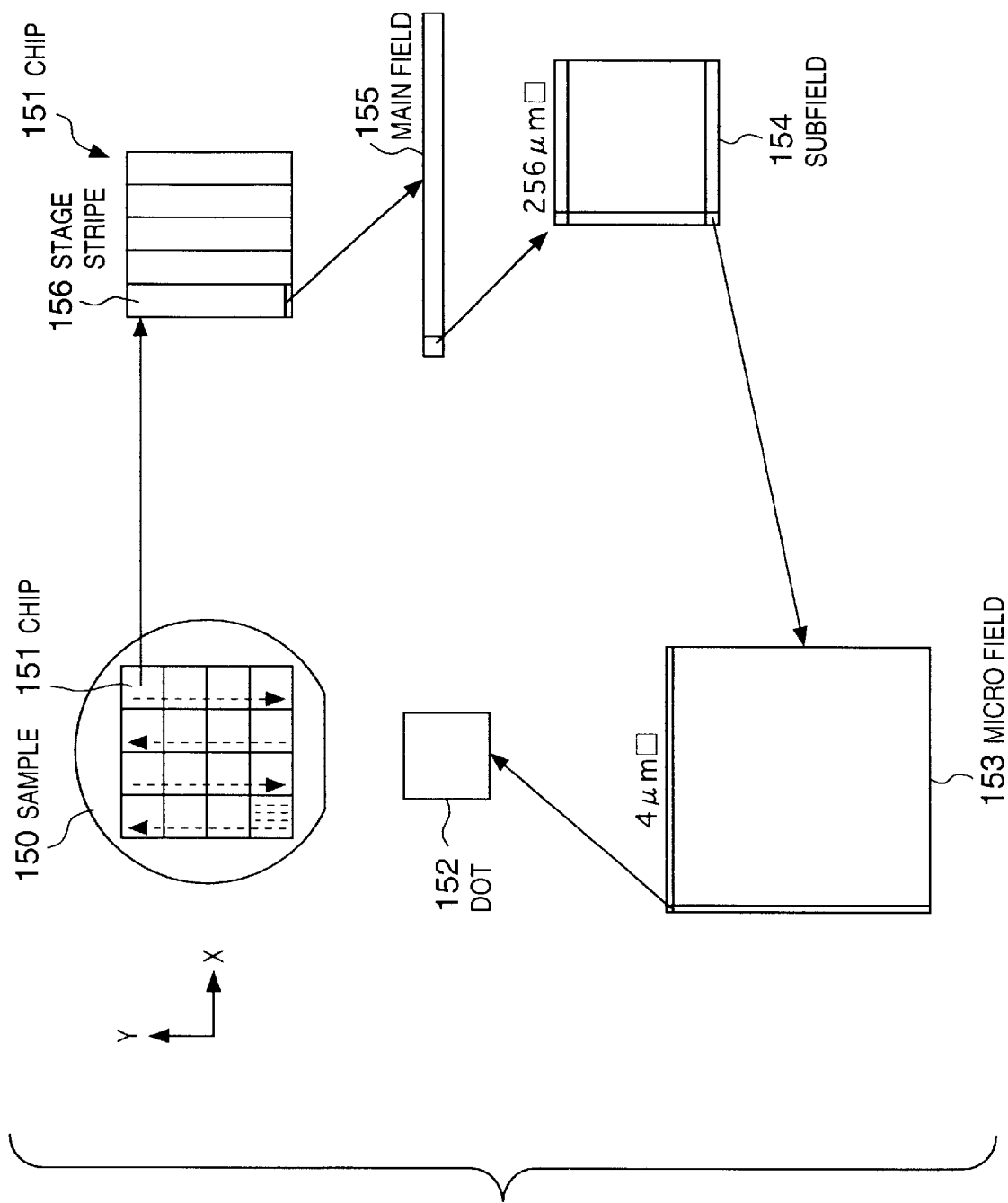
FIG. 10 is a view showing a pattern drawing region in this embodiment in detail.

FIG. 10 shows a state in which a pattern is drawn by the operations of the deflectors and X-Y stage.

In FIG. 10, reference numeral 150 denotes a sample which is to be exposed to a pattern and is a wafer in this case; 151, circuit chips formed on the wafer 150; 152, dots as minimum pattern drawing units. One dot 152 is the reduced/projected image of one intermediate image 126 by the elementary beam 121, and a plurality of dots are formed in a matrix layout on the sample. When the dot layout pitch is set to, e.g., 4 $\mu$m, the dot 152 is deflected and scanned in the X and Y directions by the sub-deflector 149 within a square of 4-$\mu$m region (micro field 153) to draw a predetermined pattern within the region. Since 64×64 dots are simultaneously drawn in corresponding micro fields 153, dots are simultaneously drawn in a square of 256-$\mu$m (4 $\mu$m×64) region by a series of operations. This region is a subfield 154. The subfield 154 is scanned in the X direction by the main deflector 148 to obtain a main field 155. The size of the main field 155 is determined by the deflection width of the main deflector 148. In this case, the deflection width of the main deflector 148 is set to about 4 mm. Then, the main field 155 has 16 aligned subfields. The main field 155 is scanned in the Y direction by the X-Y stage 9 to draw a stage-stripe 156. In pattern drawing on the stage stripe 156, the X-Y stage 9 is continuously driven. To suppress the pattern connection between the main fields 155, the pattern connection between the subfields within each main field 155, and pattern drawing distortion in each subfield, the main deflector 148 comprises a Y-direction deflector so as to follow Y-direction movement of the X-Y stage 9 using this deflector. By repetitively drawing the stage stripes 156, the pattern is drawn on the circuit chip 151. Note that the main deflector 148 may be constituted by two swing-back deflectors.

Figure 11:
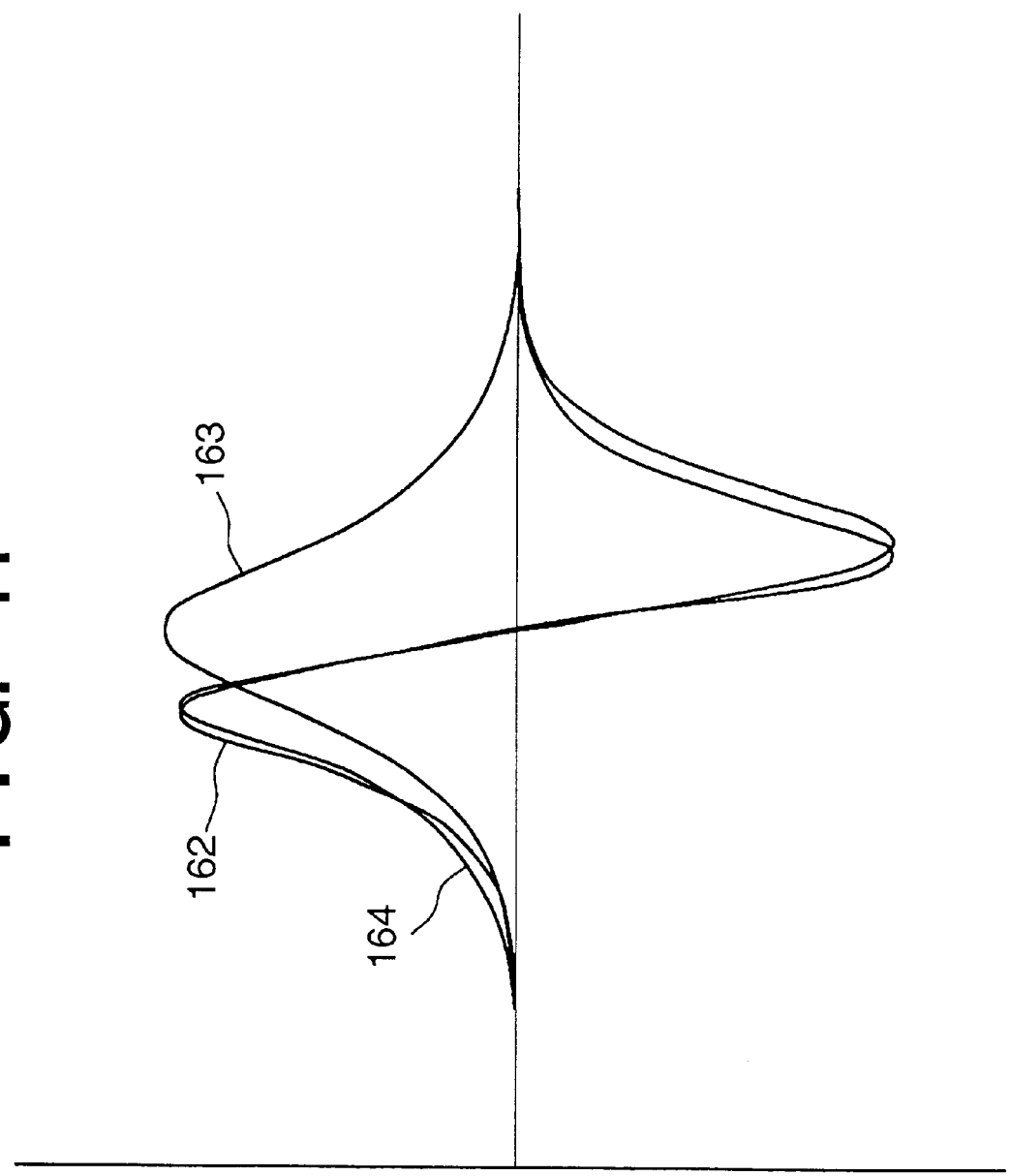
FIG. 11 is a graph showing the magnetic field layout of an MOL in this embodiment.

Referring back to FIG. 9, reference numeral 160 denotes a dynamic focus coil having a hollow core structure that adjusts an image of the intermediate image 126 obtained by the reduction projection lens 143 to be formed at a predetermined position for each subfield 154 on the basis of the deflection amount of the main deflector 148. The reduction projection lens 143 made up of the first and second reduction lenses 141 and 142 is a so-called MOL (MOvable Lens) type lens, and comprises MOL correction coils 161. The MOL correction coils 161 are driven based on the deflection amount of the main deflector 148 so as to satisfy so-called MOL conditions and always attain optimal characteristics. FIG. 11 is a graph showing a correction magnetic field 162 necessary to satisfy MOL conditions, an original magnetic field 163 of the reduction projection lens 143, and a magnetic field 164 actually generated by the MOL correction coils 161. In FIG. 1, the correction magnetic field curve 162 satisfies primary MOL conditions. Each MOL correction coil is driven such that the magnetic field 164 generated by the MOL correction coils 161 coincides with the correction magnetic field 162.

Referring back to FIG. 9, a refocus coil 170 is driven within a given time period on the basis of the magnitude of the total beam current of the elementary beam 121 flowing through the column of the reduction projection system 8, and corrects the blur of each elementary beam 121 on the image plane by a space-charge effect and the like. Of the elements of the reduction projection system 8, the dynamic astigmatism correction coil 144, magnification correction coil 146, main deflector 148, sub-deflector 149, dynamic focus coil 160, MOL correction coils 161, and refocus coil 170 are driven by the control system 25 (to be described later). The field lens 140 and the first and second reduction lenses 141 and 142 are driven and controlled by the power supply system 26.

The above-described elements are fixed to the lens barrel support 17, and insulated by the lens barrel mount 18 from vertical and horizontal displacements, floor vibrations, and other disturbance vibrations. The electrooptic system including the irradiation system 2, CLA unit 4, blanker array 6, and reduction projection system 8 is always kept in a high vacuum by the main body vacuum pump 22.

Figure 12:
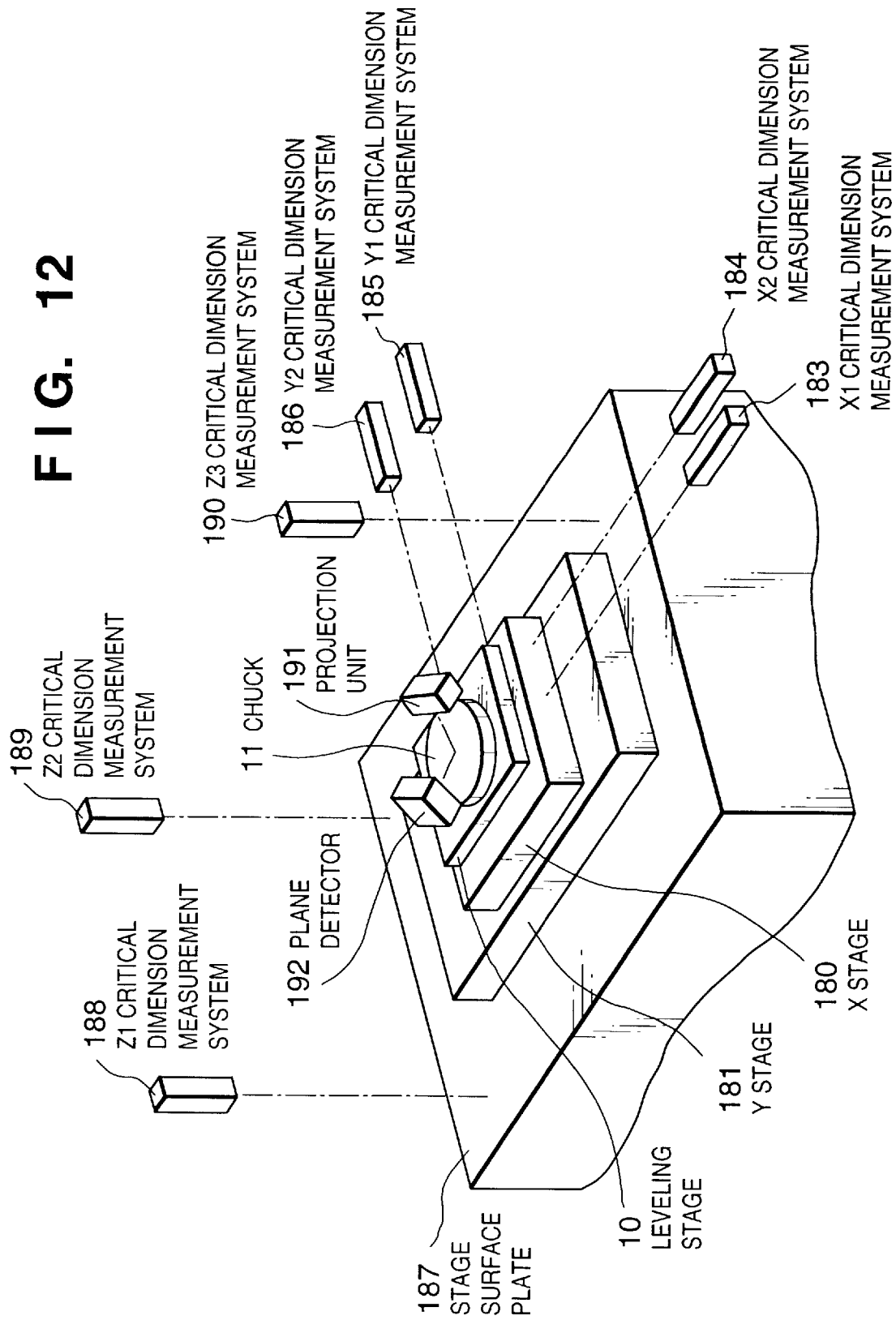
FIG. 12 is a perspective view showing an X-Y stage and its peripheral arrangement in this embodiment in detail.

FIG. 12 is a perspective view showing the X-Y stage 9, leveling stage 10, chuck 11, and plane measurement system 12 in detail. In FIG. 12, the X-Y stage 9 is made up of two, X and Y stages 180 and 181, and comprises a critical dimension measurement system and critical dimension correction system using a laser interferometer system for each axis. For the X-axis, the X-Y stage 9 comprises an X1 critical dimension measurement system 183 and an X2 critical dimension measurement system 184 for correcting yawing along the X-axis. For the Y-axis, the X-Y stage 9 comprises a Y1 critical dimension measurement system 185 and a Y2 critical dimension measurement system 186 for correcting yawing along the Y-axis. Reference numeral 187 denotes a stage surface plate which has three critical dimension measurement systems Z1 (188), Z2 (189), and Z3 (190) in order to measure the relative relationship between the upper surface of the stage surface plate 187 and the reduction projection system 8. During pattern drawing, this relationship is always monitored and controlled to provide optimal drawing conditions. The plane measurement system 12 is a multiple reflection optical distance measurement system using a plurality of beams. The plane measurement system 12 is comprised of a projection unit 191 for projecting a plurality of measurement beams to a sample surface, and a plane detector 192 for detecting the reflected beams of the measurement beams from the sample surface. The plane detector 192 detects the height of the sample surface irradiated with the measurement beam on the basis of the detected position of the measurement beam reflected by the sample surface. This processing can be executed for a plurality of measurement points to obtain the tilt and height of the sample surface. Based on these values, the leveling stage 10 having degrees of freedom in the optical axis direction (Z direction) and three angular directions (Wx, Wy, and θ) can be driven to keep the tilt and height of the sample surface on the chuck 11 in an optimal state in pattern drawing.

Driving control of the X-Y stage 9, driving control of the leveling stage 10, and measurement driving and measurement value processing of the plane measurement system 12 are executed by the control system 25. The X-Y stage 9 is supported by the stage mount 20 so as to suppress vertical and horizontal vibrations and displacements. At the same time, to prevent degradation of the drawing precision caused by vibrations of the X-Y stage 9 and leveling stage 10 owing to a driving reaction force upon driving the X-Y stage 9, the driving reaction force of the X-Y stage which propagates to the stage mount 20 is absorbed by the stage reaction force support 21.

The space where the X-Y stage 9, leveling stage 10, chuck 11, plane measurement system 12, off-axis scope 13, and the like are arranged is the work chamber 14. The work chamber 14 is always kept evacuated to a high vacuum by the main body vacuum pump 22.

Figure 13:
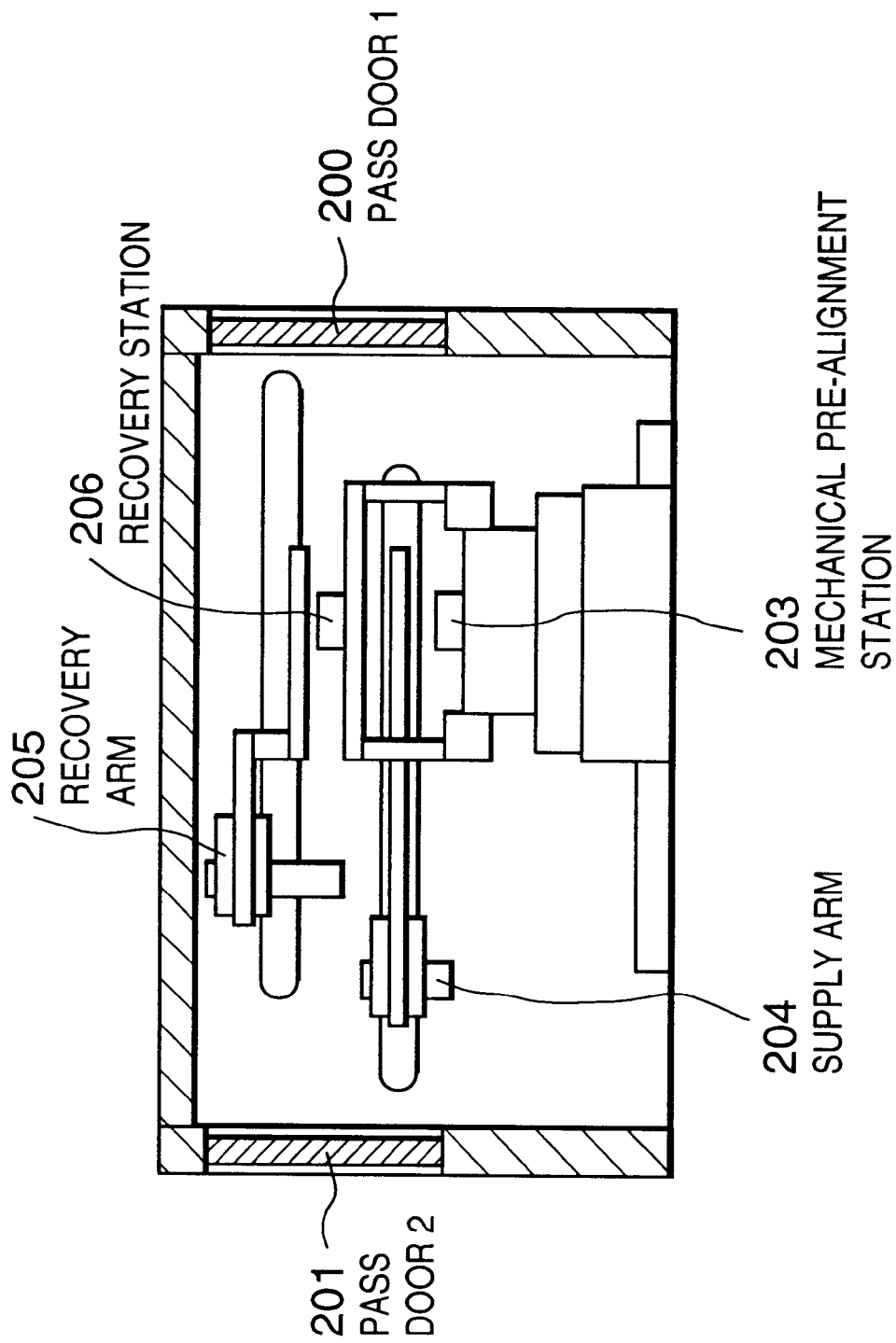
FIG. 13 is a sectional view showing the interior of a pre-chamber in this embodiment in detail.

FIG. 13 is a sectional view showing the structure of the pre-chamber 15. In FIG. 13, reference numeral 200 denotes a pass door 1; and 201, a pass door 2. The two doors and pre-chamber vacuum pump 23 are used to transfer a sample without decreasing the vacuum degree in the apparatus. Reference numeral 203 denotes a mechanical pre-alignment station for aligning the direction and position of a sample in transferring it to the chuck 11; 204, a supply arm for conveying the mechanically pre-aligned sample to the chuck 11; 205, a recovery arm for recovering the sample exposed to a pattern from the chuck 11; and 206, a recovery station for temporarily holding the sample recovered by the recovery arm. In general, recovery and supply of samples are simultaneously executed to minimize the sample exchange time.

The apparatus having the above arrangement is controlled by the control system 25. The control system 25 will be explained in detail.

Figure 14:
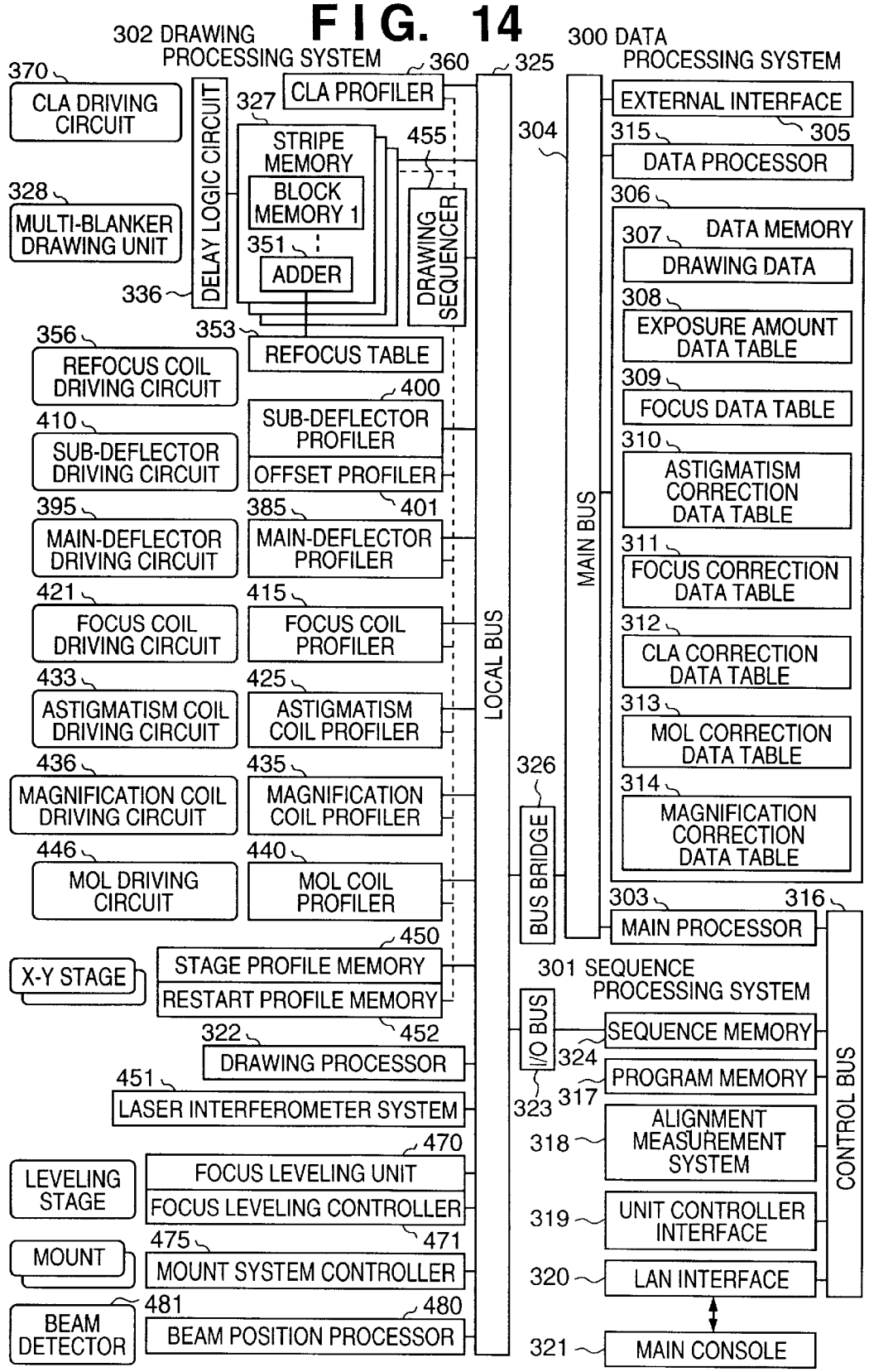
FIG. 14 is a block diagram showing a control system in this embodiment in detail.

FIG. 14 is a block diagram showing the whole control system 25. In FIG. 14, the control system is constituted by three, data processing system 300, sequence processing system 301, and drawing processing system 302. Reference numeral 303 denotes a main processor for controlling the whole apparatus and sample processing; and 304, a main bus on which elements concerning drawing data processing are mainly arranged. These elements constitute the data processing system 300. An external interface 305 mainly provides high-speed communication with the data server 28.

Drawing data in the data server 28 is transferred via the interface at a very high speed. A data memory 306 stores drawing data 307 transferred from the data server 28. The data memory 306 also stores the following data tables; an exposure amount data table 308 which stores exposure amount data necessary for sample processing, a focus data table 309 which stores height (focus) data of the sample surface in pattern drawing, an astigmatism correction data table 310 which stores the driving parameters of the dynamic astigmatism correction coil 144, a focus correction data table 311 which stores the driving parameters of the dynamic focus coil 160, a CLA correction data table 312 which stores the driving parameters of the unipotential lenses 122 to 125 of the CLA unit 4, an MOL correction data table 313 which stores the driving parameters of the MOL correction coil, and a magnification correction data table 314 which stores the driving parameters of the magnification correction coils 146 and 147. A data processor 315 generates control data corresponding to control elements (to be described later) from the drawing data 307 in the data memory and the data tables 308 to 314.

Reference numeral 316 denotes a control bus on which control elements concerning sample processing are arranged. These control elements constitute the sequence processing system. Reference numeral 317 denotes a program memory which stores the control programs of the whole apparatus and sample processing sequence programs; 318, an alignment measurement system for performing various alignment measurement operations such as alignment of the sample and calibration of the reference position; 319, a unit controller interface for communicating with respective units such as the power supply controller 27 of the power supply system 26, chamber 24, and convey system 16; 320, a man-machine interface with the operator serving as a LAN interface for communicating with a monitor which monitors creation of jobs for defining sample processing, setting of various parameters for defining the characteristics of the apparatus, and the operation state of the apparatus, and a main console 321 which issues various commands to the apparatus.

Reference numeral 322 denotes a drawing processor made up of a plurality of DSPs and MPUs to control the drawing processing system 302. A sequence memory 324 is mounted on an I/O bus 323. A sequential command response, status information, and the like from the main processor 303 are exchanged between the I/O bus 323 and the main processor 303. Modules for driving the constituent elements of the apparatus concerning drawing processing are arranged on a local bus 325. To transfer driving data to these modules, a bus bridge 326 is laid between the local bus 325 and the main bus 304. Driving data for these modules is directly transferred between the data memory 306 and the modules via the bus bridge 326 to shorten the data transfer time.

Reference numeral 327 denote stripe memories which store dot ON/OFF data and exposure amount data for drawing a desired pattern on the sample by driving the multi-blanker 136. Data in the memories for respective dots are sequentially transferred to a driving unit 328 of the multi-blanker 136. The stripe memories 327 are arranged for respective stripes, and a stripe memory is selected in correspondence with a stripe to be drawn.

Figure 15:
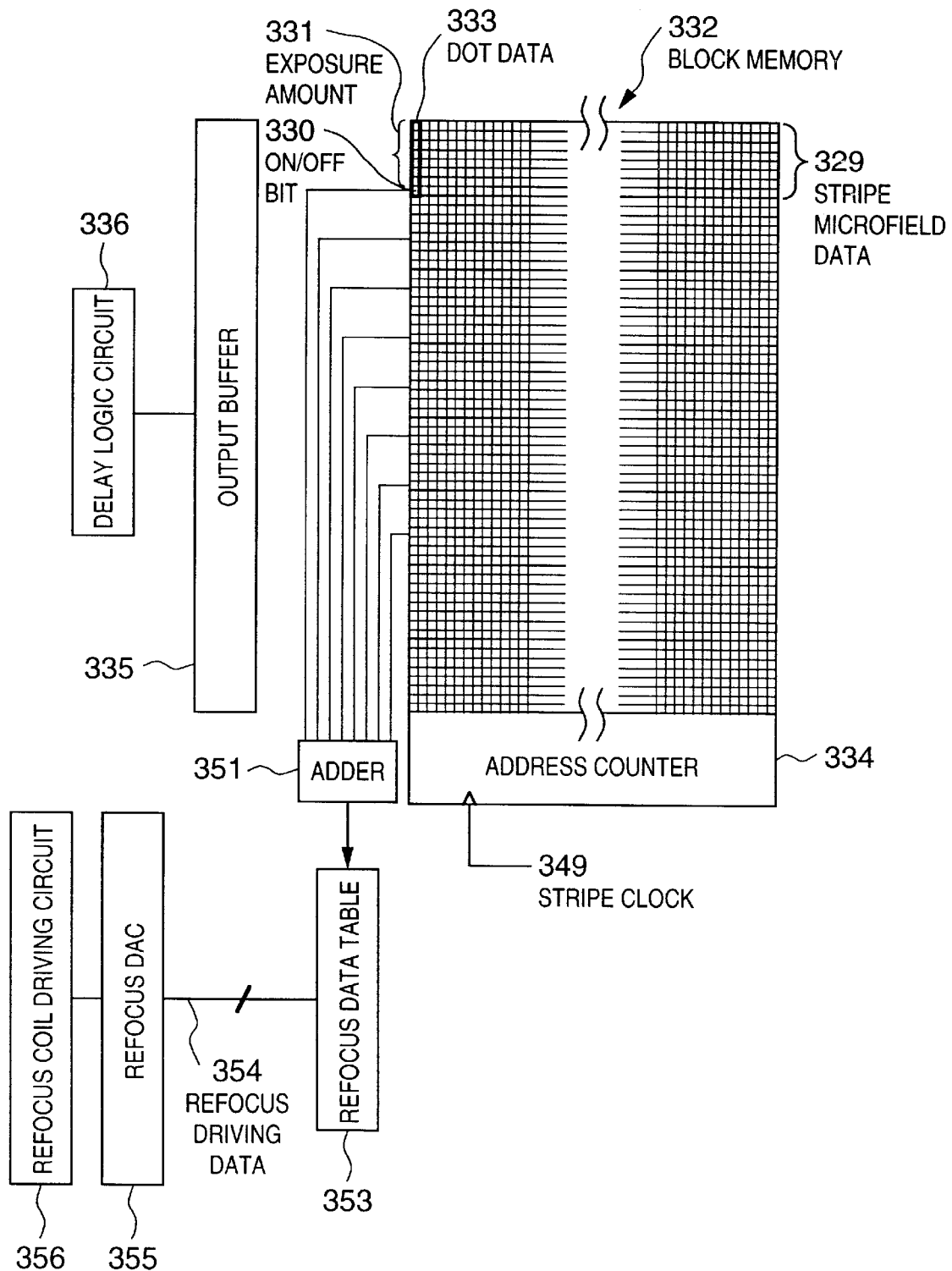
FIG. 15 is a diagram showing a stripe memory in this embodiment in detail.

FIG. 15 is a diagram showing one stripe memory 327 and its peripheral circuit in detail. In FIG. 15, reference numeral 329 denotes stripe microfield data which includes exposure information of one stripe for one elementary beam and forms a data string made up of ON/OFF bits 330 and exposure amount data 331. Stripe microfield data are combined for eight elementary beams, and processed as one block memory 332. In practice, 512 block memories are used for one stripe. While the 512 block memories for one stripe are simultaneously driven, a pattern is drawn.

Figure 16:
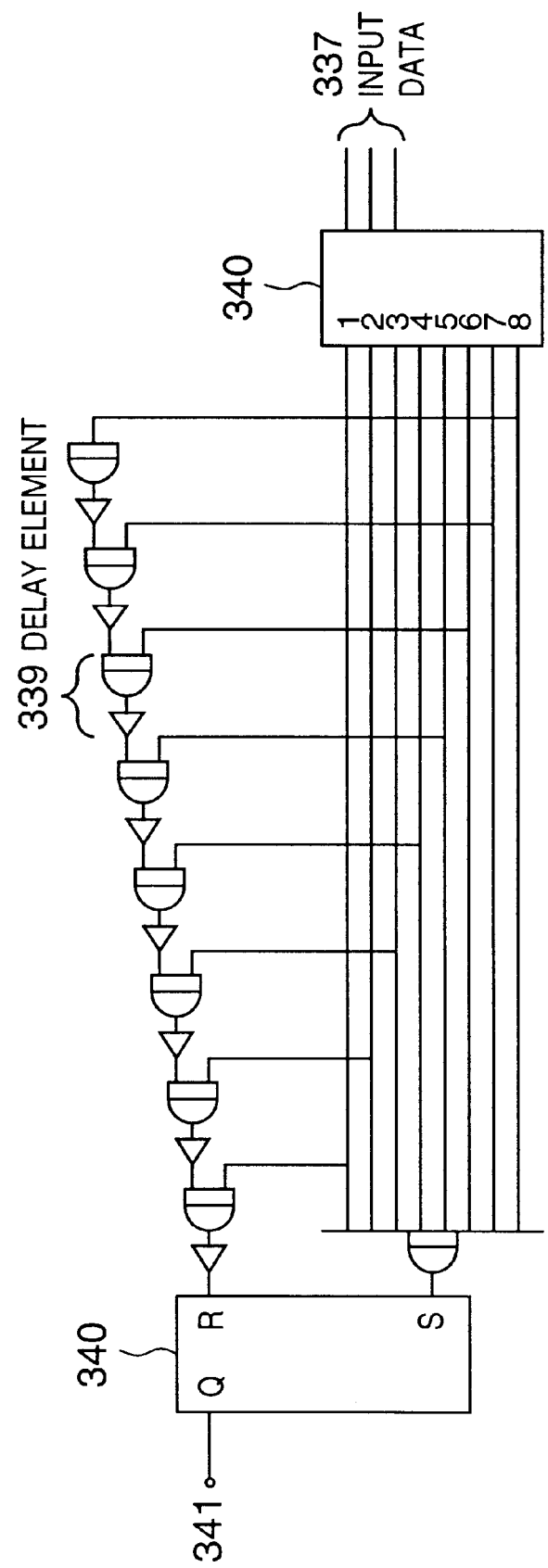
FIG. 16 is a circuit diagram showing a delay logic circuit in this embodiment in detail.
Figure 17:
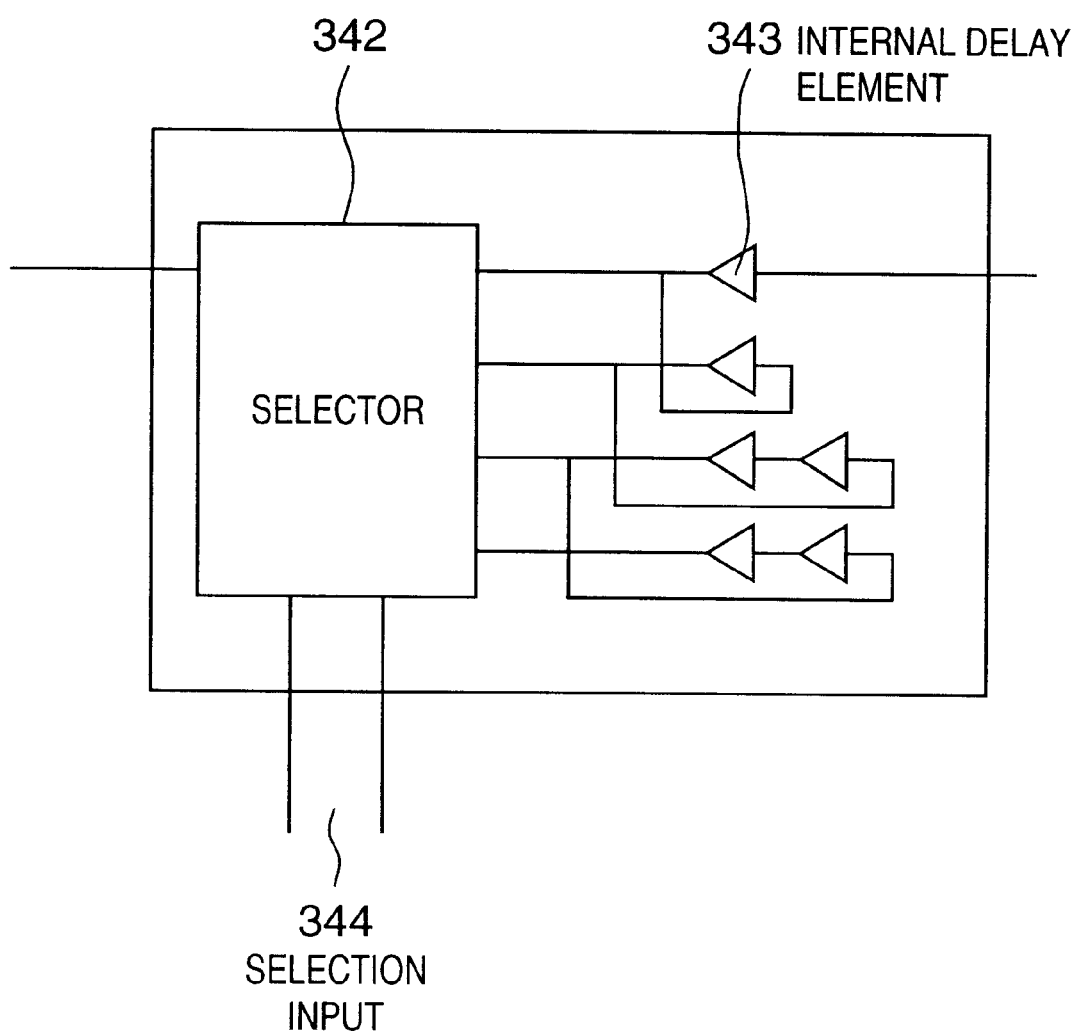
FIG. 17 is a diagram showing the interior of the delay logic circuit in this embodiment in detail.

In this case, the stripe microfield data 329 is a data string of 8-bit dot data 333 each of which has the least significant bit serving as an elementary beam ON/OFF bit and upper 7 bits serving as an exposure amount. Dot data are sequentially transmitted to a delay logic circuit 336 via an output buffer 335 in accordance with addresses represented by an address counter 334 of the block memory 332. The address counter 334 counts in synchronism with a stripe clock 349. The delay logic circuit 336 is a logic circuit for converting 7-bit exposure amount data into an exposure pulse time width. The delay logic circuit 336 is shown in FIG. 16 in detail. For descriptive convenience, exposure amount data is made up of 3 bits in FIG. 16. In FIG. 16, reference numeral 337 denotes input data (exposure amount data); 338, a 3-to-8 decoder; 339, a delay element; and 340, a set/reset flip-flop. An output signal 341 changes to high level (ON) when a signal is input to the set input of the set/reset flip-flop 340, and changes to low level (OFF) when a signal is input to the reset input. As the value of the input data 337 increases, the reset input signal passes through a larger number of delay elements to prolong the delay time. As a result, the flip-flop 340 can obtain a so-called variable duty output signal 341 whose ON time is determined in proportion to the value (duty) of the input data 337. Each delay element 339 has a structure as shown in FIG. 17. In FIG. 17, the number of internal delay elements 343 can be selected from one, two, four, and eight in accordance with a selection input 344 of a selector 342. The dose can be changed in association with changes in drawing sync clocks (to be described later) without changing the input data 337, i.e., duty data. Note that input data is made up of 3 bits. However, as for 7-bit data, an output signal whose ON time is proportional to the value of input data can be similarly obtained with a larger circuit scale. In this case, an input data value of 0 means that the exposure amount is 0 and the elementary beam is kept off.

In this manner, the exposure amount data 331 is converted into an elementary beam ON time, and output to a blanker driving circuit 350 of the multi-blanker 136. The blanker driving circuit 350 passes the elementary beam only for the ON time of the input signal to obtain an exposure amount proportional to the ON time. The elementary beam ON/OFF bit 330 as the least significant bit of the stripe microfield data 329 is used for correction of a so-called Coulomb effect. All the dot data ON/OFF bits 330 corresponding to 4,096 elementary beams emitted simultaneously are added by an adder 351 to obtain a sum output 352. A refocus table 353 stores driving data of the refocus coil 170 associated with the size of an input address. The refocus table 353 is addressed using the sum output 352 to obtain refocus driving data 354 associated with the sum output 352. The refocus driving data 354 is D/A-converted by a refocus DAC 355 and output to a refocus coil driving circuit 356. The driving amount of the refocus coil 170 is determined in accordance with the number of elementary beams emitted simultaneously among the 4,096 elementary beams. The imaging position of the intermediate image 126 is adjusted to correct a so-called Coulomb blur in real time.

Figure 18:
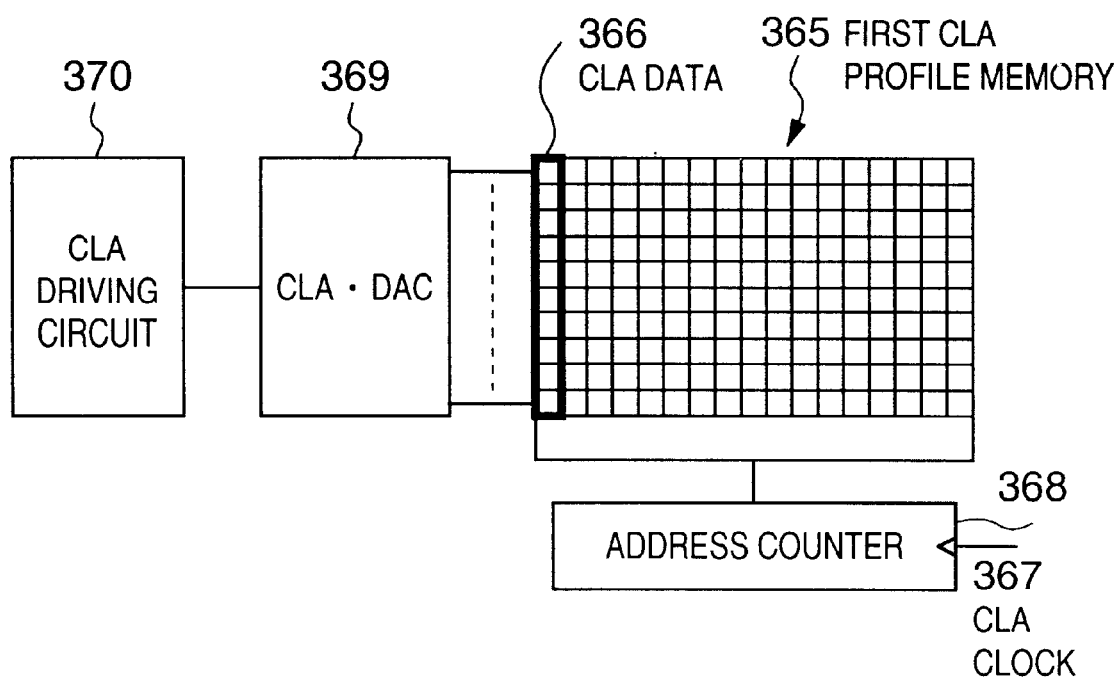
FIG. 18 is a block diagram showing a CLA profiler in this embodiment in detail.

Referring back to FIG. 14, reference numeral 360 denotes a CLA profiler including memories which store the driving data of the first to fourth unipotential lenses 122 to 125 of the CLA unit 4. The CLA profiler 360 is shown in FIG. 18 in detail. In FIG. 18, reference numeral 365 denotes a first CLA profile memory which stores the driving data of the first unipotential lens 122. Although not shown, second to fourth CLA profile memories are similarly constituted in correspondence with the second to fourth unipotential lenses 123 to 125. CLA data 366 stored in the first CLA profile memory 365 is obtained by encoding a voltage applied to the intermediate electrode of the first unipotential lens 122, and has a 10-bit data width. As described above, the intermediate electrodes of each unipotential lens are classified into rows or columns. Hence, 64 profile memories are actually formed for each unipotential lens. Each of the profile memories stores 10-bit data. By combining these data, a desired intermediate image is obtained in the above-mentioned way. The imaging state of the intermediate image 126 changes depending on the deflection amount by the main deflector 148. The CLA data 366 is set for each deflection step of the main deflector 148 to adjust power distribution of the unipotential lenses. For this reason, the first CLA profile memory 365 comprises 16 types of CLA data in correspondence with the number of deflection steps of the main deflector 148. The 16 types of CLA data are addressed by an address counter 368 synchronized with a CLA clock 367. CLA data corresponding to the deflection amount of the main deflector is transmitted, converted into an analog amount by a CLA DAC 369, and supplied to a CLA driving circuit 370. The same processing is done for the second to fourth unipotential lenses 123 to 125. By optimally driving these unipotential lenses, a desired imaging state can be attained.

Figure 19:
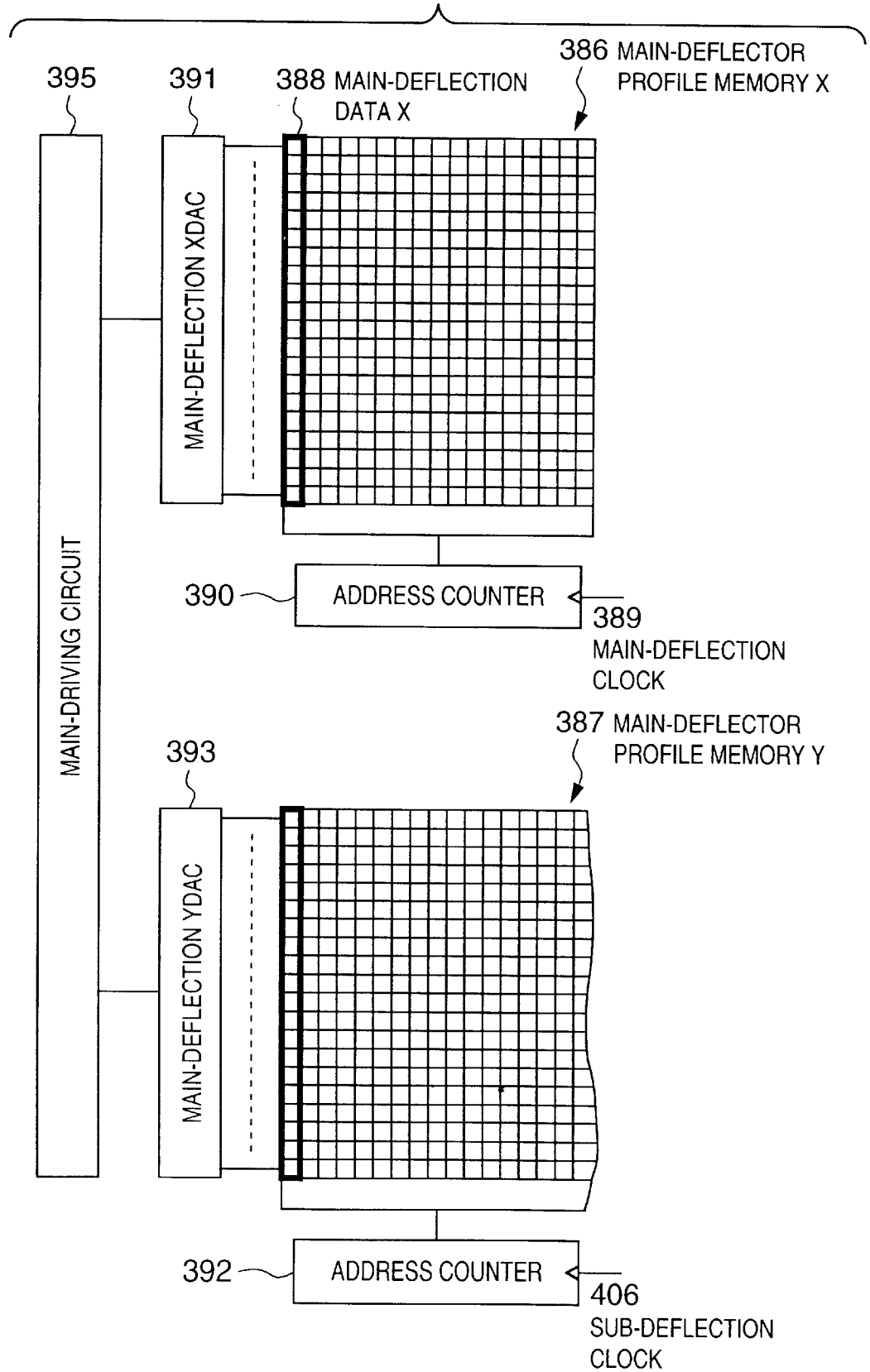
FIG. 19 is a block diagram showing a main-deflector profiler in this embodiment in detail.

Referring back to FIG. 14, a main-deflector profiler 385 includes memories which store 20-bit driving data of the main deflector 148. The main-deflector profiler 385 is shown in FIG. 19 in detail. Since the main deflector 148 comprises deflectors for two, X and Y directions in FIG. 19, respective driving data are stored in two, main-deflector profile memories X (386) and Y (387). Main-deflection X data 388 in the main-deflector profile memory X 386 is obtained by encoding the X-direction deflection voltage of the main deflector 148, and is deflection control data in one deflection step. In this embodiment, the main-deflector profile memory X 386 stores 16 types of main-deflection X data 388. Main-deflection X data 388 corresponding to the deflection amount in a given step is read out by addressing using an address counter 390 synchronized with a main-deflection clock 389. The readout data is converted into an analog amount by a main-deflection XDAC 391, and supplied to a main-deflector driving circuit 395 to obtain a desired deflection amount. On the other hand, Y deflection of the main deflector follows continuous movement of the X-Y stage 9 along the Y-axis, so that the main-deflector profile memory Y 387 stores driving data of the main deflector Y for each sub-deflection clock 406 (to be described below), i.e., the drawing position of each drawing dot. Each data is made of 20 bits, similar to the data X. These data are read out by an address counter 392 in synchronism with the sub-deflection clock 406, converted into an analog amount by a main-deflection YDAC 393, and supplied to the main-deflector driving circuit 395. Note that if so-called two-stage deflection or multi-stage deflection is to be performed, a plurality of profilers are adopted to execute the same control.

Figure 20:
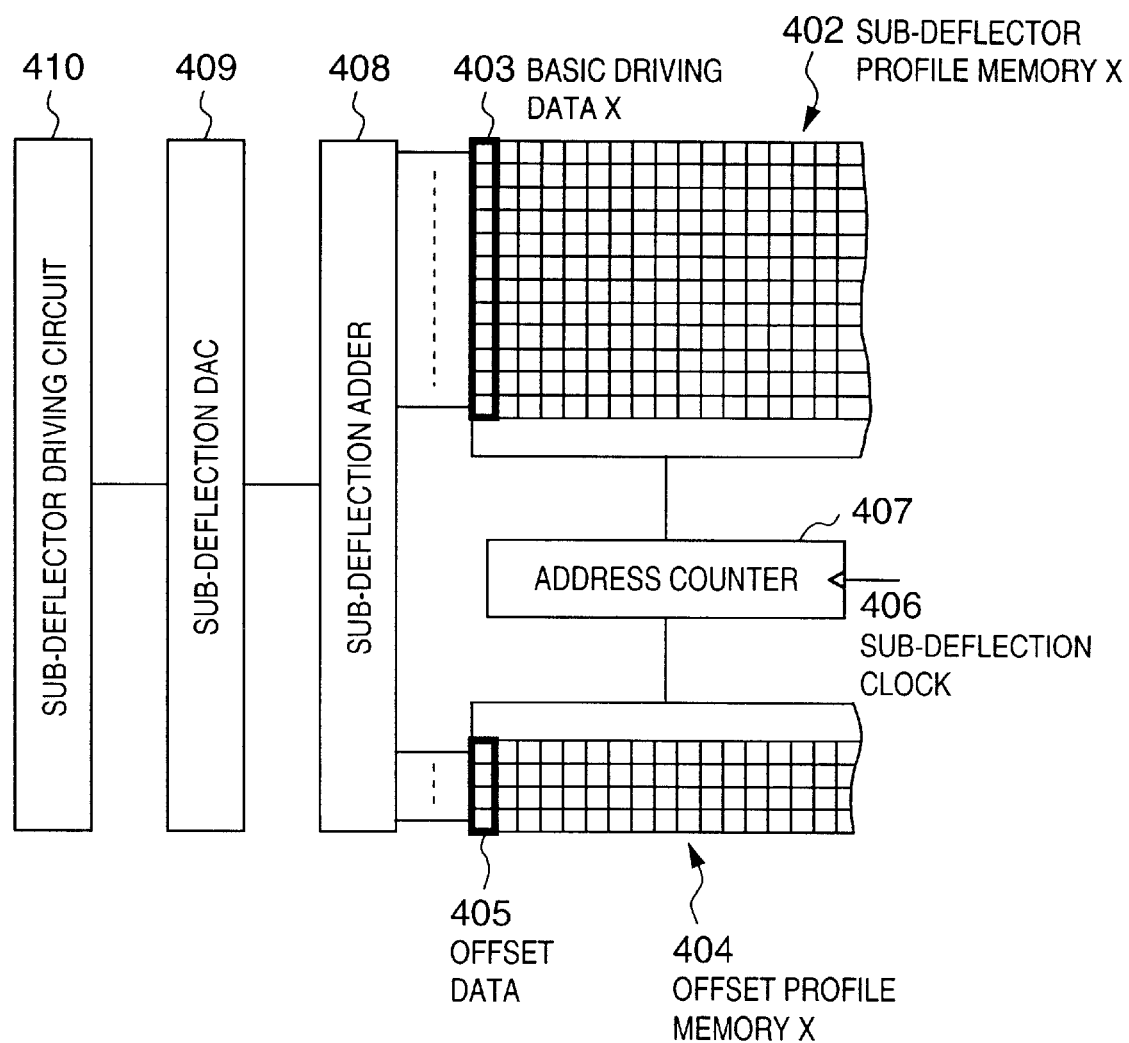
FIG. 20 is a block diagram showing a sub-deflector profiler in this embodiment in detail.

Referring back to FIG. 14, reference numeral 400 denotes a sub-deflector profiler; and 401, an offset profiler as a profile memory which stores 12-bit driving data and 4-bit offset data of the sub-deflector 149. The sub-deflector profiler 400 and offset profiler 401 are shown in FIG. 20 in detail. In FIG. 20, reference numeral 402 denotes a sub-deflector profile memory X which stores basic driving data X 403 of the sub-deflector 149 in the X direction. In this embodiment, the dot resolution of the micro field 153 is set to 160×160, and thus 160×160 basic driving data 403 in the X and Y directions are laid out. Reference numeral 404 denotes an offset profile memory X which stores offset adjustment data in driving the sub-deflector 149, and stores offset data 405. In general, the offset data is 0, and is used to correct in real time the positional drift of an elementary beam corresponding to the operation status of the apparatus. Each basic data in the sub-deflector profile memory X (402) and offset data in the offset profile memory X (404) are addressed by an address counter 407 synchronized with a sub-deflection clock 406, and input to a sub-deflection adder 408 which outputs the sum of these data. The output from the sub-deflection adder 408 is converted into an analog amount by a sub-deflection DAC 409, and supplied to a sub-deflector driving circuit 410. The same processing is also done in the Y direction of the sub-deflector 149.

Figure 21:
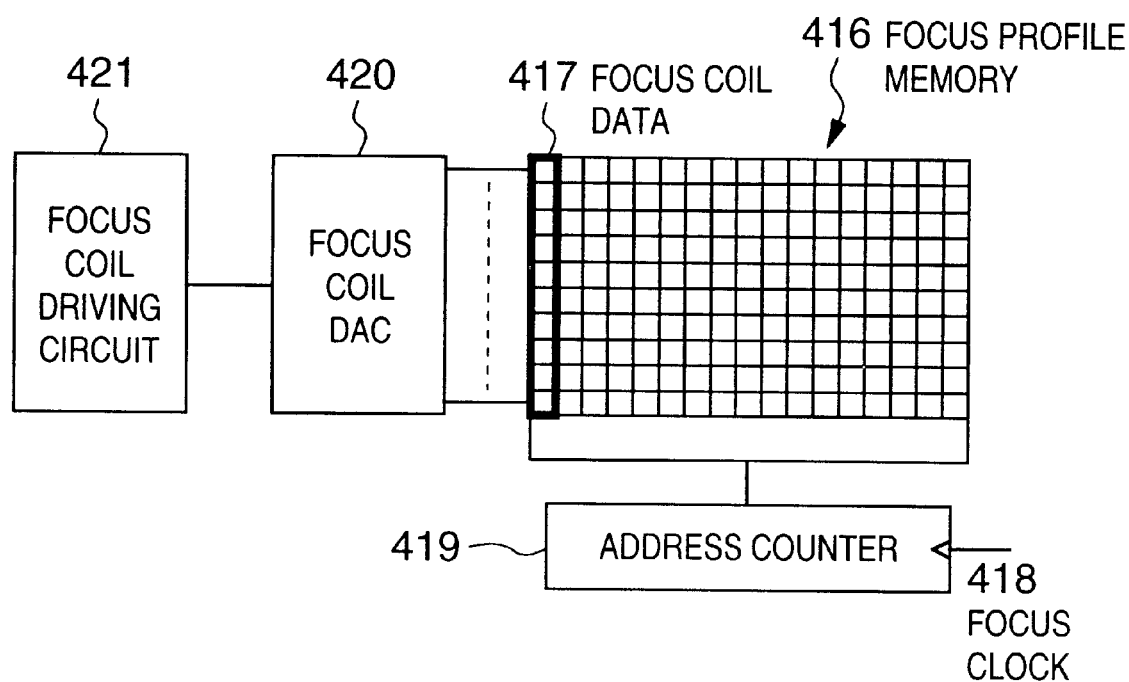
FIG. 21 is a block diagram showing a focus coil profiler in this embodiment in detail.

Referring back to FIG. 14, reference numeral 415 denotes a focus coil profiler serving as a memory which stores 10-bit driving data of the dynamic focus coil 160. The focus coil profiler 415 is shown in FIG. 21 in detail. In FIG. 21, reference numeral 416 denotes a focus profile memory which stores focus coil data 417. The dynamic focus coil 160 functions as dynamic focus for adjusting the imaging position by the reduction projection system 8 in accordance with the deflection amount of the main deflector 148. In this embodiment, the number of deflection steps of the main deflector 148 is 16, so that 16 types of focus coil data are stored in the focus profile memory 416. The focus profile memory 416 is addressed by an address counter 419 synchronized with a focus clock 418 synchronized with the deflection clock of the main deflector 148. Then, focus coil data corresponding to the deflection amount of the main deflector 148 is output to a focus coil DAC 420. The focus coil DAC 420 converts this data into an analog amount, and outputs it to a focus coil driving circuit 421.

Figure 22:
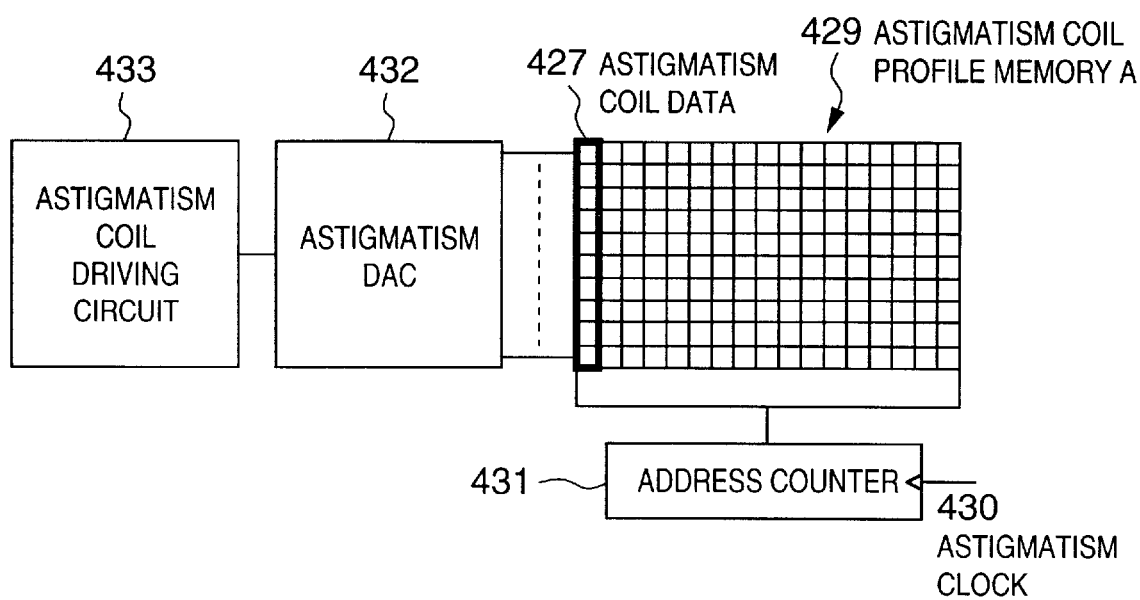
FIG. 22 is a block diagram showing an astigmatism correction coil profiler in this embodiment in detail.
Figure 23:
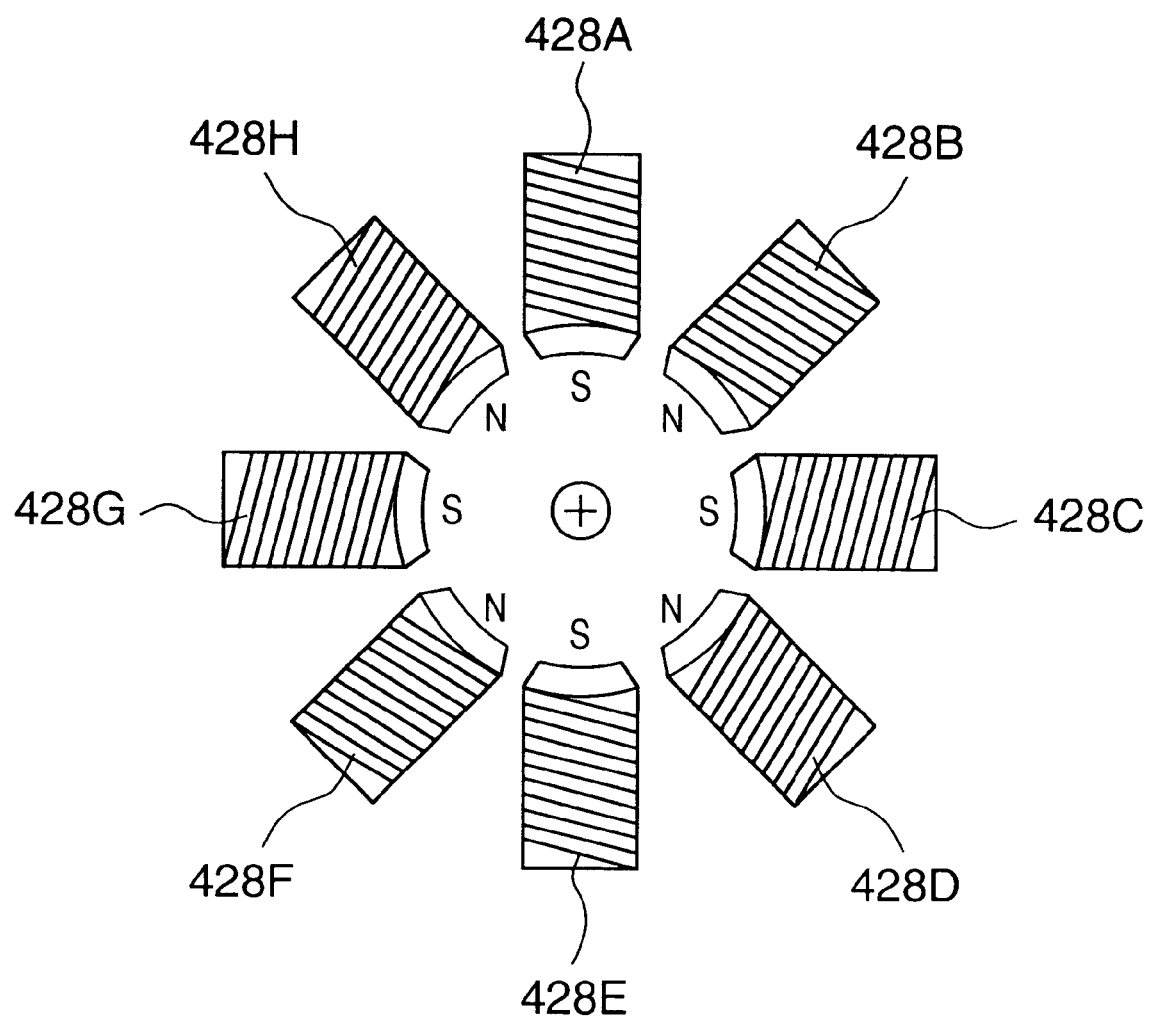
FIG. 23 is a view showing an astigmatism correction coil in this embodiment.

Referring back to FIG. 14, reference numeral 425 denotes an astigmatism correction coil profiler including memories which store 12-bit driving data of the dynamic astigmatism correction coil 144. The astigmatism coil profiler 425 is shown in FIG. 22 in detail. In FIG. 22, reference numeral 429 denotes astigmatism coil profile memories which store astigmatism coil data 427. The dynamic astigmatism correction coil 144 is formed from four pairs of opposing magnetic poles laid out every 45°, and has, e.g., a structure shown in FIG. 23. The astigmatism coil profiler 425 has eight profile memories in correspondence with the energized coils of four pairs of opposing magnetic poles 428A to 428H in FIG. 23. An astigmatism coil profile memory A (429) stores astigmatism coil data of one magnetic pole 428A. Astigmatism coil profile memories corresponding to the remaining seven magnetic poles also have the same arrangement, and only the astigmatism coil profile memory A (429) will be explained. Since the driving amount of dynamic astigmatism correction coil 144 is determined in accordance with the deflection amount of the main deflector 148, the number of deflection steps of the main deflector, i.e., 16 types of astigmatism driving data are stored in the astigmatism coil profile memory A 429. The astigmatism coil profile memory A 429 is addressed by an address counter 431 synchronized with an astigmatism clock 430 synchronized with the deflection clock of the main deflector 148 to output astigmatism coil data 427 corresponding to the deflection amount of the main deflector 148 to an astigmatism DAC 432. The astigmatism DAC 432 converts the astigmatism coil data 427 into an analog amount and supplies the analog amount to an astigmatism coil driving circuit 433. This magnetic pole coil and the remaining seven magnetic pole coils, i.e., the total of eight coils suppress generation of astigmatism caused by deflection of the main deflector 148.

Referring back to FIG. 14, reference numeral 435 denotes a magnification coil profiler including memories which store 10-bit driving data of the magnification correction coil 146; and 436, a magnification driving circuit for the magnification correction coil 146. The magnification coil profiler 435 has a magnification profile memory 437, magnification clock 438, address counter 439 (none of them are shown), and the like. The magnification correction coil 146 has almost the same arrangement and control method as those of the dynamic astigmatism correction coil 144, and a detailed description thereof will be omitted.

Figure 24:
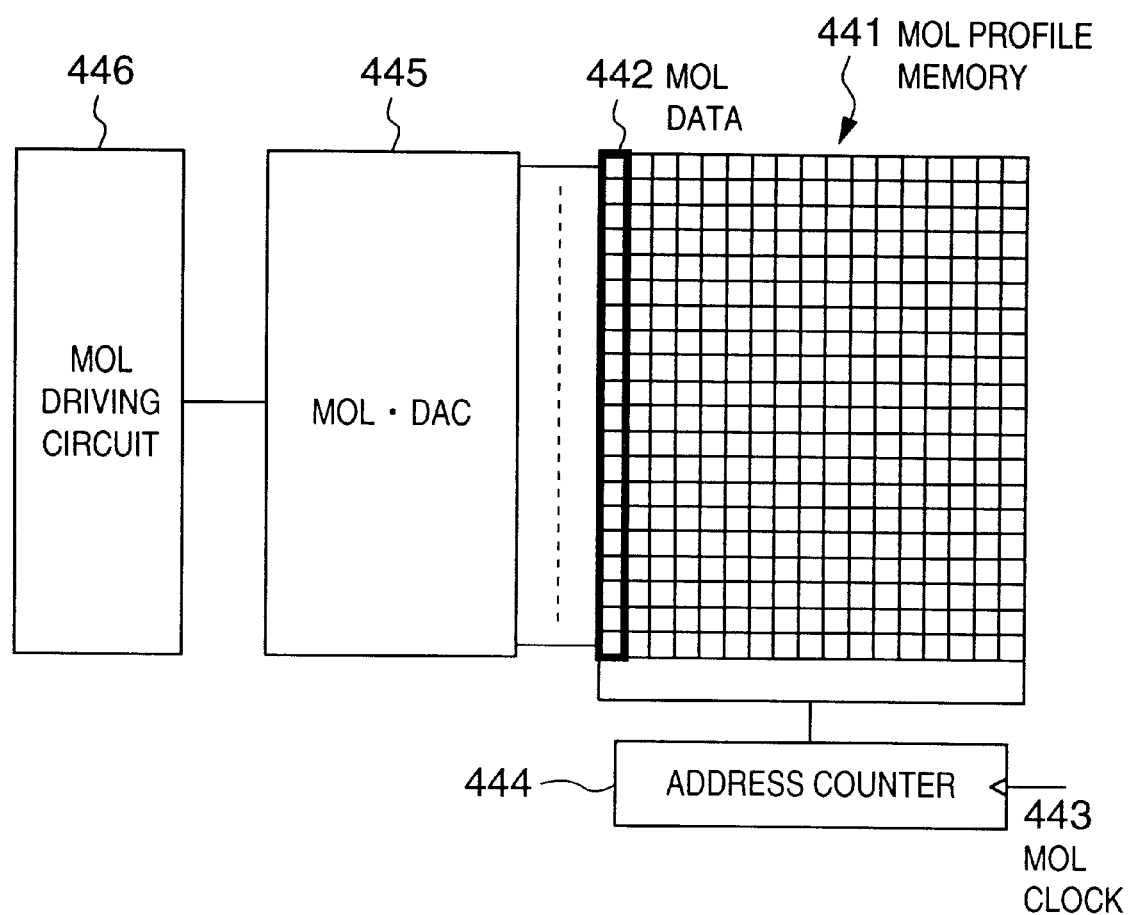
FIG. 24 is a block diagram showing an MOL profiler in this embodiment in detail.

Reference numeral 440 denotes an MOL coil profiler including memories which store 20-bit driving data of the MOL correction coils 161. The MOL coil profiler 440 is shown in FIG. 24 in detail. The MOL correction coils 161 have a four-stage structure. Each stage has X and Y compensation yokes, and the MOL correction coils 161 are constituted by a total of eight pairs of compensation yokes, i.e., 16 energized coils. Reference numeral 441 denotes an MOL profile memory corresponding to one of the 16 energized coils that stores MOL data 442. A total of 16 types of MOL data are stored in accordance with the deflection amounts of the main deflector 148. Driving data corresponding to the deflection amount is output by addressing using an address counter 444 in synchronism with an MOL clock 443 synchronized with the deflection clock of the main deflector. The output MOL data is converted into an analog amount by an MOL DAC 445, and supplied to an MOL driving circuit 446. The same processing is done for the remaining energized coils with the same arrangement so as to operate as a so-called MOL.

Referring back to FIG. 14, reference numeral 450 denotes a stage profile memory which stores driving locus data of the X-Y stage 9 based on a pattern drawing sequence. The X-Y stage 9 is controlled based on positional data of the criminal dimension meter using a laser interferometer system 451. Therefore, the driving locus data also includes data at the sampling interval of the X-Y stage position. The X-Y stage 9 is driven by drawing sync operation synchronized with pattern drawing operation and arbitrary operation of arbitrarily driving the X-Y stage 9. Control based on the driving locus data is drawing sync operation. The position of the X-Y stage 9 is controlled to one represented by the driving locus data at a predetermined timing. Consequently, synchronization with the main deflector 148 is established, and a pattern can be drawn while the stage is continuously moved. To the contrary, arbitrary operation is executed when the X-Y stage 9 is moved while being accelerated to a drawing start position, drawing operation restarts after a pause, or the X-Y stage 9 is driven to transfer a sample. Hence, a restart profile memory 452 is employed. When driving the X-Y stage from the current position to an arbitrary one is instructed, driving locus data is sequentially calculated from the target position and data such as the speed (vector) and driving speed mode when the X-Y stage reaches the target position. The driving locus data is written in the restart profile memory 452, and the X-Y stage 9 is arbitrarily driven based on the driving locus data. This calculation is performed in real time, and thus completed within a time shorter than the positional sampling interval of the X-Y stage 9 using the laser interferometer system. Note that restart logic is employed to cause the X-Y stage 9 to reach a pattern drawing start point at a desired speed (vector) by arbitrary operation of the X-Y stage 9 based on the restart profile memory 452 at the start of actual pattern drawing, and successively shift the X-Y stage 9 to control based on the driving locus data of the stage profile memory 450. By this operation, the X-Y stage 9 shifts to drawing sync operation.

Reference numeral 455 denotes a drawing sequencer which establishes synchronization with a plurality of driving elements, i.e., the stripe memory 327, CLA profiler 360, main-deflector profiler 385, sub-deflector profiler 400, offset profiler 401, focus coil profiler 415, astigmatism coil profiler 425, magnification coil profiler 435, and MOL coil profiler 440.

Figure 25:
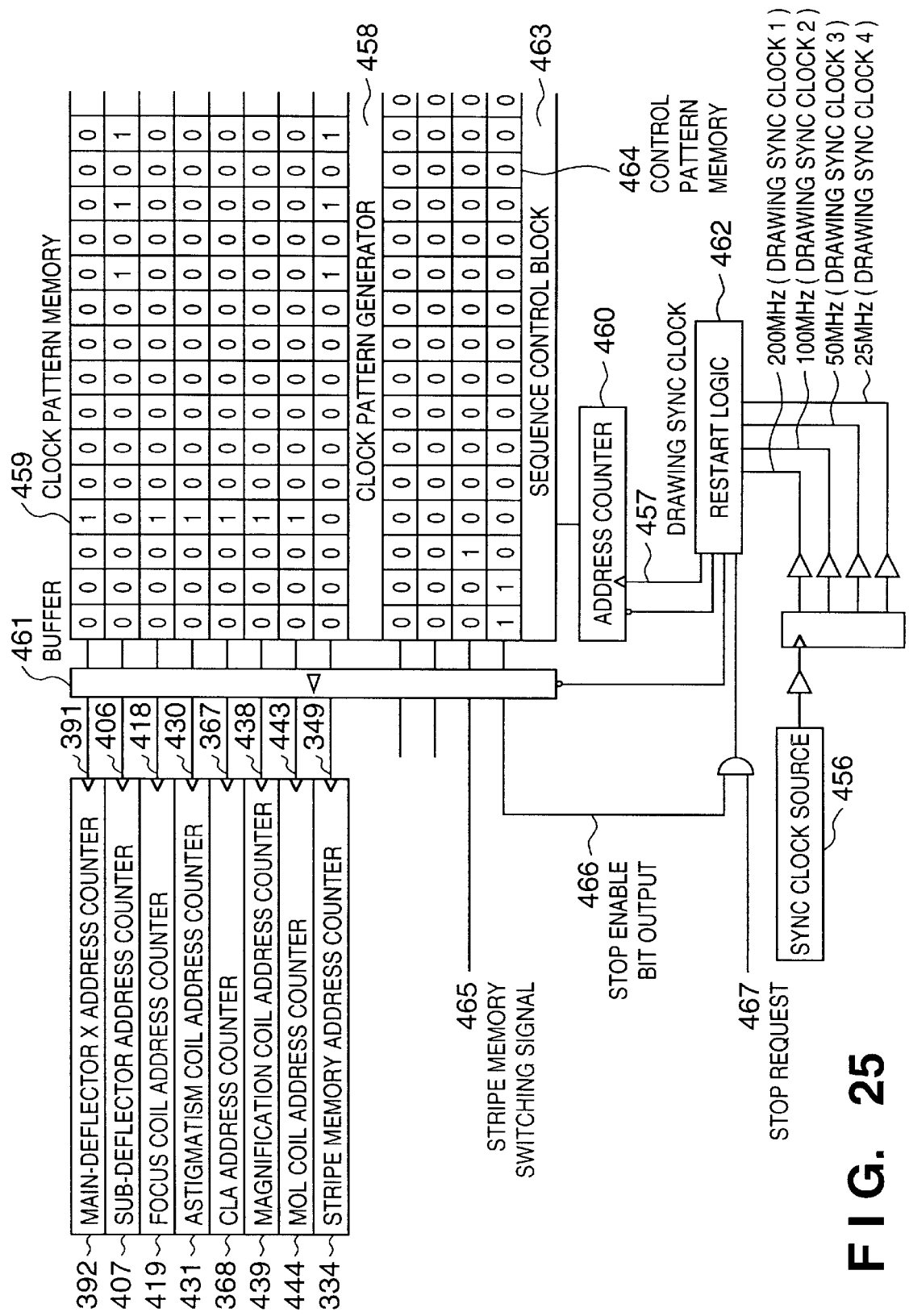
FIG. 25 is a block diagram showing a drawing sequencer in this embodiment in detail.

The drawing sequencer is shown in FIG. 25 in detail. In FIG. 25, reference numeral 456 denotes a sync clock source having a base clock of 400 MHz. The sync clock source 456 generates various clocks on the basis of the base clock. A 25-MHz clock prepared by dividing the base clock into two clocks and further dividing this 200-MHz clock into eight clocks is used as a drawing sync clock 457. The drawing system is synchronized with the drawing sync clock 457. Reference numeral 458 denotes a clock pattern generator for generating the stripe clock 349 to be supplied to the address counter 334 of the stripe memory 327, the CLA clock 367 to be supplied to the address counter 368 of the CLA profiler 360, the main-deflection clock 389 to be supplied to the address counter 392 of the main-deflector profiler 385, the sub-deflection clock 406 to be supplied to the address counter 407 of the offset profiler 401, the focus clock 418 to be supplied to the address counter 419 of the focus coil profiler 415, the astigmatism clock 430 to be supplied to the address counter 431 of the focus coil profiler 415, the magnification clock 438 to be supplied to the address counter 439 of the magnification coil profiler 435, and the MOL clock 443 to be supplied to the address counter 444 of the MOL coil profiler 440.

The clock pattern generator 458 is comprised of a clock pattern memory 459 and 40-bit address counter 460. The clock pattern memory 459 stores pattern data on which logic patterns considering clock pulses (operation commands) to be supplied to a plurality of driving elements (controllers) and the settling time of these driving elements are laid out in time-series in an address increment direction. These pattern data are read out every cycle of the drawing sync clock 457 (external signal), and supplied to the address counter of each driving element via a buffer 461.

For example, the most significant bit of pattern data stored in the clock pattern memory 459 is a bit pattern string (driving data string) representing the main-deflection clock 389 to be supplied to the address counter 392 of the main deflector X, and logic 1 (operation command) is written in the clock pattern memory at an interval corresponding to one deflection period. Similarly, logic 1 (operation command) is also written every main-deflection step period in response to respective clocks to be supplied to the address counters of driving element profilers which set driving data every main deflection step, i.e., subfield, that is, the focus coil address counter 419, CLA address counter 368, astigmatism coil address counter 431, magnification coil address counter 439, and MOL coil-address counter 444.

Note that driving data to these driving elements do not always change. In such case, logic 1 is written in a position corresponding to a timing at which driving data must be changed. On the other hand, the sub-deflection clock 406 to be supplied to the sub-deflector address counter 407 outputs logic 1 in a period twice the read period of the clock pattern generator 458. The stripe clock 349 of the stripe memory address counter 334 also outputs logic 1 in the same period. With this arrangement, exposure corresponding to exposure amount data in the stripe memory is executed every step of the sub-deflector. To ensure a settling time generated in driving stepwise the main deflector, sub-deflector, focus coil, CLA, astigmatism coil, magnification coil, MOL coil, and the like, logic 0 (non-operation command) is written between logic 1 (operation command) written every step period of the main deflector and logic 1 (operation command) corresponding to the sub-deflection clock 406 of the sub-deflector.

The number of aligned logic values 0 (non-operation command) corresponds to a delay time, settling time, or the like, and has a time adjustment function of adjusting the driving timings of respective driving elements. The number of logic values 0 (non-operation command), i.e., the time can be arbitrarily set. In pattern drawing using a vector method or the like, the deflection amount of main deflection changes, and thus the setting time can be optimized in accordance with the deflection amount to optimally control the process time. Since the same timing adjustment can be easily finely executed in accordance with the driving amount of each driving element, a high drawing precision and short process time can be attained.

In this fashion, the system can arbitrarily control the driving timings and synchronization of respective driving elements, settling time, response delay, and the like in accordance with the logic and the number of logic values 0 in the clock pattern memory. This is one feature of the embodiment.

Reference numeral 463 denotes a sequence control block addressed by the same address counter 460 as the clock pattern generator 458. Switching of the stripe memories, designation of a drawing stop enable timing, and the like are controlled by a logic pattern written in a control pattern memory 464. A stripe memory switching signal 465 is used to switch the stripe memories 327 in accordance with the drawing timing of each stripe. In this embodiment, 4-mm stripes 1 to 5 are switched and drawn. A stop enable bit output 466 is an enable signal for accepting a stop request 467 from the drawing processor 322 when pattern drawing operation must be stopped during the operation owing to any cause. Logic 1 is output at a stoppable timing. Upon reception of the stop request, restart logic 462 stops outputting the drawing sync clock 457 to the address counter 460, thereby stopping the operations of the clock pattern generator 458 and sequence control block 463. The restart logic 462 relays the start or restart timings of driving processing and drawing processing up to a drawing start position and a drawing restart position when the operation pauses. The restart logic 462 further has a function of selecting one of the above-described four types of clocks and using the selected one as the drawing sync clock 457. By switching these clocks, the maximum value of the dose by each elementary beam can be changed. As described above, the selector 342 of the delay logic circuit 336 operates interlockingly with switching of the drawing sync chock, thereby selecting the dose.

Referring back to FIG. 14, reference numeral 470 denotes a focus leveling unit for processing a signal obtained by the plane measurement system 12 and calculating plane data defined by the height and tilt of the sample surface; 471, a focus leveling controller for driving the leveling stage 10 based on the plane data obtained by the focus leveling unit and causing the sample surface to match the imaging surface of the main field; and 475, a mount system controller for controlling the lens barrel mount 18, stage mount 20, and stage reaction force support 21. The lens barrel mount 18 is an air-servo active mount for mainly preventing transfer of floor vibrations to the lens barrel support. The stage mount is a hybrid active mount using an air servo and motor for preventing floor vibrations and suppressing internal vibrations generated upon driving the X-Y stage 9. Furthermore, this embodiment uses the stage reaction force support 21 to absorb a reaction force generated upon accelerating/decelerating the X-Y stage 9, thereby greatly reducing generated vibrations. The stage reaction force support 21 is an electromagnetic support using a voice coil motor and the like. The stage reaction force support 21 supports the stage by the thrust of the voice coil motor only when a reaction force is generated, and does not act when the acceleration is 0. Reference numeral 480 denotes a beam position processor which calculates and stores the position and intensity of each elementary beam from a signal obtained by a beam position detector 481. The beam position is measured in performing various adjustment and correction operations. For example, the beam position is used as a reference position in so-called baseline measurement, and for measurement of the intensity of each elementary beam, measurement of the beam position drift for calibrating the beam position, and the like.

The arrangement of the control system 25 and its constituent elements have been described. In this embodiment, the data processing system 300, sequence processing system 301, and drawing processing system 302 have independent buses and processors. For example, while the drawing processing system 302 executes pattern drawing, the data processing system 300 receives and processes drawing data from the data server 28. In this way, various processes can be asynchronously executed regardless of other systems, which is a feature of the control system.

Setting of initial parameters necessary for the wafer process and adjustment of the respective units of the apparatus will be described before description of actual wafer processing. The apparatus has various mechanical offsets and electrical offsets. These offsets are measured and adjusted during the assembly of the apparatus, and assumed to have already been input. Setting of parts directly concerning the wafer process and drawing performance will be explained.

The part concerning drawing performance must set respective correction tables in the data memory 306 of the data processing system 300. Correction data to be set includes astigmatism correction data, focus correction data, CLA correction data, magnification correction data, and MOL correction data. These data are used to correct changes in image characteristics caused by the deflection position of the main deflector 148. As a method generally used to obtain the correction amount, test patterns capable of determining respective correction amounts are actually drawn on a sample, developed, and observed with an optical microscope or the like, thereby obtaining the correction amounts from these patterns. This method is the most reliable at present though it takes a long time for acquiring data. The embodiment also adopts this method.

The part concerning the wafer process similarly sets the exposure amount data table 308 and focus data table 309. This setting is executed in a step called an exposure condition setting step. While the exposure amount and focus value are changed stepwise, a test pattern is actually drawn on a sample, developed, and observed to obtain an optimal exposure amount and focus position.

In addition, so-called alignment processing must be done to align respective layers. The embodiment realizes this function using an off-axis scope. As described above, the off-axis scope is formed from an optical microscope having a different measurement axis from that of the reduction projection system 8. To measure an alignment mark on a wafer, a measurement value with respect to the optical axis of the projection system can be originally obtained so long as the on-axis beam of the projection can be used. However, in some cases, the off-axis measurement system is used as in this embodiment for various reasons. In this case, problems arise from variations in the positional relationship (baseline) between the measurement axis of the off-axis measurement system and the optical axis of the projection system. To prevent this, this type of apparatus appropriately performs so-called baseline measurement to correct the influence of variations. In baseline measurement of this embodiment, the positions of references on the X-Y stage 9 are measured by an exposure beam and the off-axis scope, and calculated as positions on the coordinate system of the X-Y stage. The difference between the measured positions is a baseline. In measuring a wafer alignment mark, the baseline is subtracted from the position of the alignment mark obtained by the off-axis scope to attain the position of the alignment mark as a position with respect to the optical axis of the projection system. Since the baseline varies owing to various factors, baseline measurement is properly executed to correct the measurement value. Accordingly, the measurement value of the alignment mark position can always fall within a given error range.

Exposure Step

A series of exposure steps will be described with reference to FIG. 26 so as to explain how to process drawing data and a wafer serving as a sample in the above-mentioned apparatus arrangement on the assumption that various settings are executed at appropriate timings in actual wafer exposure processing.

Figure 26:
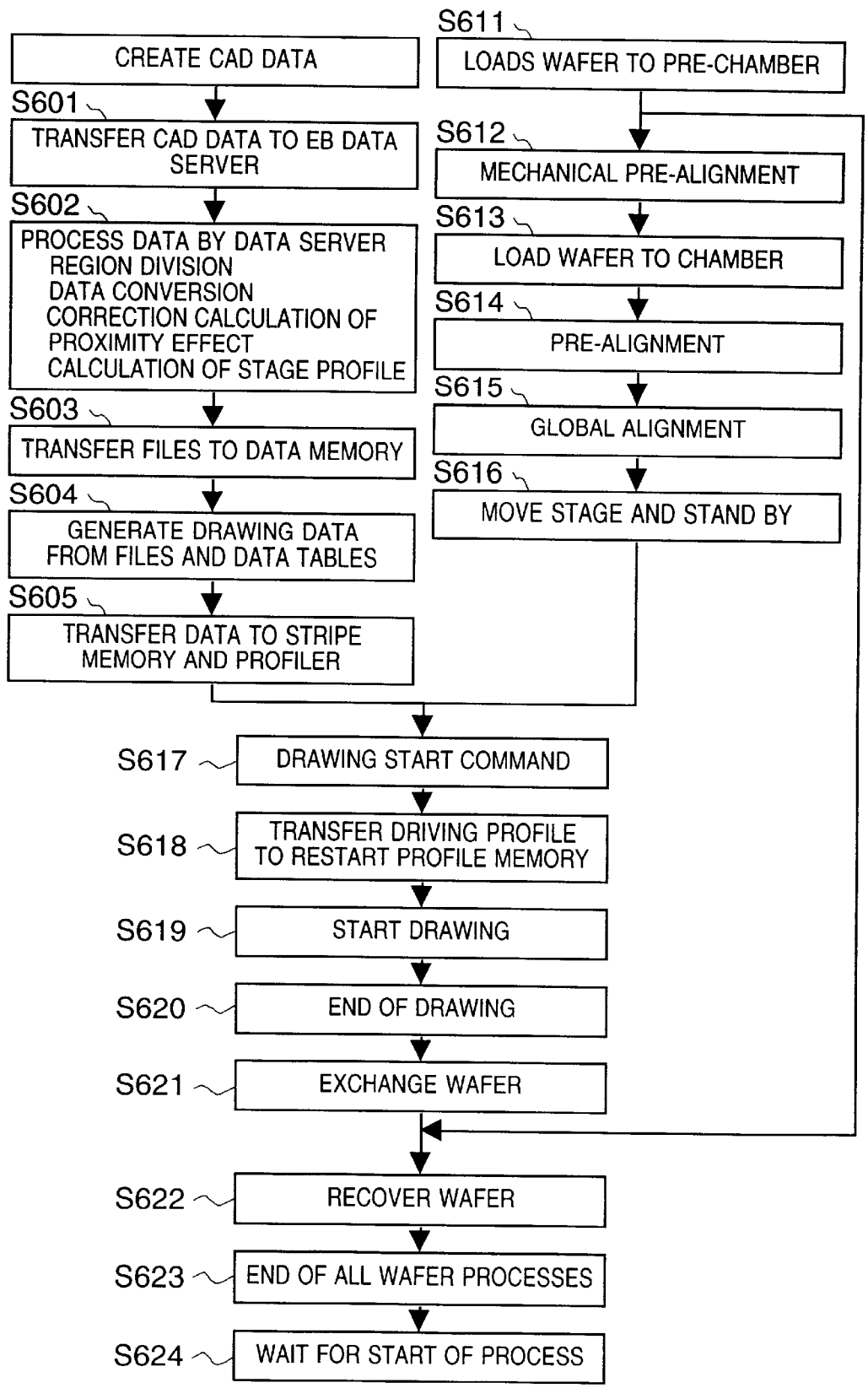
FIG. 26 is a flow chart showing a wafer process in this embodiment.

In FIG. 26, pattern data created by a so-called pattern CAD are transferred to the data server 28 (step 601). The transferred data are data of a so-called CAD format, and cannot be directly processed by the drawing apparatus. Thus, the data server 28 converts the data into ones of a format processible by the drawing apparatus to create files of a predetermined format (step 602). Note that data conversion mainly includes conversion from graphic data to dot data, stripe division, calculation of a stage profile, correction of the proximity effect, and the like.

The files are transferred to the data memory via the external interface 305 of the control system 25 (step 603). After the transfer of the files, the data processor 315 generates drawing data while referring to the values of the data tables 308 to 314 (step 604). The generated data are transferred to the stripe memories 327 and profilers of the drawing processing system 302 (step 605). Then, drawing operation can start.

Meanwhile, a wafer to be exposed to a pattern is transferred by the convey system 16 to the mechanical pre-alignment station 203 of the pre-chamber 15 (step 611), and subjected to mechanical pre-alignment while the pre-chamber 15 is evacuated (step 612). Upon the completion of pre-alignment, the wafer is transferred from the pre-chamber 15 onto the chuck 11 by the supply arm 204, and fixed by electrostatic chuck by the chuck (step 613). If alignment processing is necessary, the wafer undergoes pre-alignment processing by the off-axis scope (step 614). In pre-alignment, a pre-alignment mark patterned on the wafer is measured to obtain the position and roughly align the wafer. Then, a pattern layout parameter on the wafer is attained using so-called global alignment, and coordinate conversion of the driving coordinate system of the X-Y stage 9 is executed (step 615). Upon the completion of alignment processing, the X-Y stage 9 moves to an exposure start standby position and stands by (step 616). All the preparations necessary for pattern drawing have been completed.

If the main processor 303 transmits a drawing start command, the drawing processor 322 starts drawing processing (step 617). The drawing processor 322 calculates a driving profile from the standby position to pattern drawing start position of the X-Y stage 9, and writes the profile in the restart profile memory 452 (step 618). The X-Y stage 9 starts moving in accordance with the restart profile. If the X-Y stage 9 reaches the drawing start position, drawing starts in accordance with the drawing sequencer 455 and restart logic (step 619). In pattern drawing, clock data is read out from the clock pattern memory 459 of the drawing sequencer at the period of a drawing sync clock and supplied to the address counters of the stripe memories 327 and respective profilers. Driving data of the driving elements are read out, and these elements are driven based on the driving data. In this manner, the driving elements are completely synchronized with a clock pattern in the clock pattern memory 459, which establishes synchronization of the whole system and realizes accurate drawing processing. During pattern drawing, the next wafer to be processed is transferred by the convey system 16 to the mechanical pre-alignment station of the pre-chamber 15, and subjected to mechanical pre-alignment to complete preparations for the next process. After all the patterns are drawn on the wafer (step 620), wafers are exchanged between the pre-chamber 15 and the work chamber 14 (step 621). The wafer is recovered from the chuck 11 by the recovery arm 205 of the pre-chamber 15, and moved to the recovery station 206. At the same time, the next wafer is supplied. The newly supplied wafer is processed in accordance with step 613 to step 620. The wafer having undergone drawing processing is recovered from the pre-chamber 15 by the convey system 16 (step 622). The series of operations are repeated until all the wafers undergo drawing processing. Upon the completion of processing to all the wafers (step 623), the apparatus waits for the start of a next process (step 624).

Device Manufacturing Method

An embodiment of a device manufacturing method using the above electron beam exposure apparatus will be explained.

Figure 27:
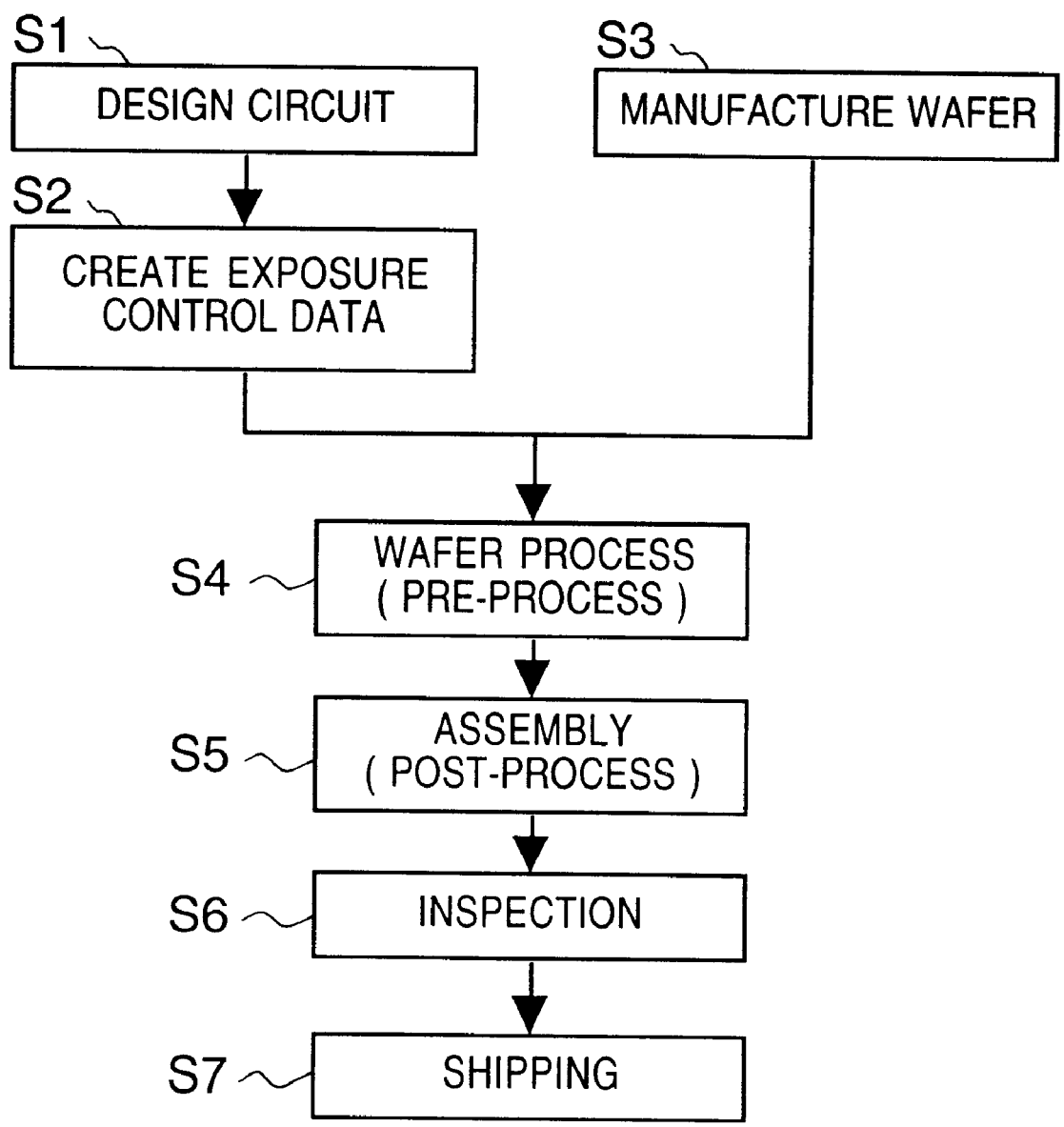
FIG. 27 is a flow chart for explaining a microdevice manufacturing flow.

FIG. 27 shows the manufacturing flow of a microdevice (semiconductor chip such as an IC or LSI, liquid crystal panel, CCD, thin-film magnetic head, micromachine, or the like). In step 1 (circuit design), a semiconductor device circuit is designed. In step 2 (creation of exposure control data), exposure control data of the exposure apparatus is created based on the designed circuit pattern. In step 3 (wafer manufacture), a wafer is manufactured using a material such as silicon. In step 4 (wafer process) called a pre-process, an actual circuit is formed on the wafer by lithography using the wafer and the exposure apparatus which receives the prepared exposure control data. Step 5 (assembly) called a post-process is the step of forming a semiconductor chip using the wafer manufactured in step 4, and includes an assembly process (dicing and bonding), packaging process (chip encapsulation), and the like. In step 6 (inspection), inspections such as the operation confirmation test and durability test of the semiconductor device manufactured in step 5 are conducted. After these steps, the semiconductor device is completed and shipped (step 7).

Figure 28:
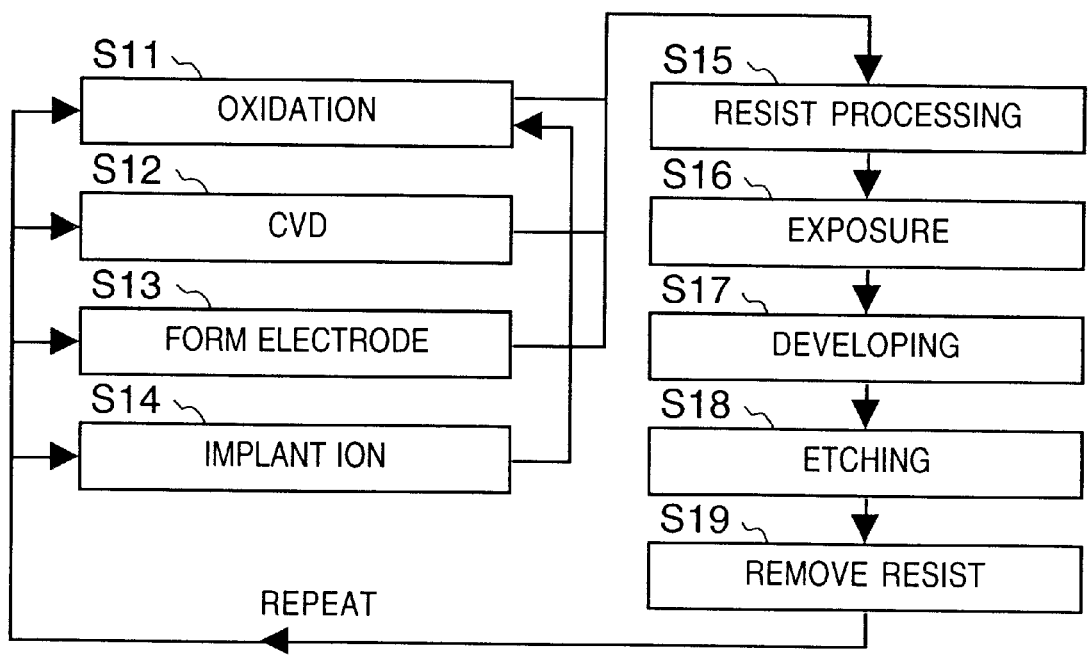
FIG. 28 is a flow chart for explaining a wafer process.

FIG. 28 shows a detailed flow of this wafer process. In step 11 (oxidation), the wafer surface is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist processing), a photosensitive agent is applied to the wafer. In step 16 (exposure), the above-described exposure apparatus exposes the wafer to a circuit pattern. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The manufacturing method of this embodiment can manufacture at low cost a highly integrated semiconductor, which is difficult to manufacture in the prior art.

As has been described above, the preferred embodiment of the present invention can provide a charged-particle beam exposure apparatus having high productivity which can achieve an optimal exposure sequence because operation commands to a plurality of driving elements are managed in accordance with the same time-series data.

The present invention is not limited to the above embodiments and various changes and modifications can be made within the spirit and scope of the present invention. Therefore, to apprise the public of the scope of the present invention the following claims are made.

What is claimed is:

1. A charged-particle beam exposure apparatus for drawing a pattern on an object to be exposed using a charged-particle beam, comprising:
a plurality of driving elements for drawing the pattern on the object while scanning the object with the charged-particle beam;
a plurality of driving data memories for storing a plurality of time-series driving data strings for respectively driving said plurality of driving elements; and
a clock pattern memory for storing a plurality of operation command data strings obtained by aligning operation commands and non-operation commands in time-series, the operation commands and the non-operation commands constituting each operation command data string being sequentially supplied to a corresponding driving data memory of said plurality of driving data memories,
wherein each of said plurality of driving data memory sequentially supplies data constituting the time-series driving data string to a corresponding driving element of said plurality of driving elements in accordance with the operation commands supplied by said clock pattern memory.

2. The apparatus according to claim 1, wherein said plurality of driving elements include a plurality of types of driving elements.

3. The apparatus according to claim 1, wherein said plurality of driving elements include a deflector for deflecting the charged-particle beam.

4. The apparatus according to claim 1, wherein said plurality of driving elements include an irradiation controller for controlling irradiation of the charged-particle beam to the object.

5. The apparatus according to claim 4, wherein said irradiation controller controls whether the object is irradiated with the charged-particle beam and/or an irradiation time of the charged-particle beam to the object.

6. The apparatus according to claim 1, wherein said plurality of driving elements include:
a first deflector for deflecting the charged-particle beam and scanning a subfield of the object with the charged-particle beam; and
a second deflector for deflecting the charged-particle beam and changing a subfield to be scanned.

7. The apparatus according to claim 1, wherein the apparatus further comprises:
a charged-particle beam source; and
an electrooptic system for projecting on the object the charged-particle beam emitted by said source, and
said plurality of driving elements include a focus correction unit for correcting a focal position of said electrooptic system.

8. The apparatus according to claim 1, wherein the apparatus further comprises:
a source for generating a charged-particle beam; and
an electrooptic system for projecting on the object the charged-particle beam emitted by said source, and
said plurality of driving elements include an astigmatism correction unit for correcting astigmatism of said electrooptic system.

9. The apparatus according to claim 1, wherein the apparatus further comprises:
a source for generating a charged-particle beam; and
an electrooptic system for projecting on the object the charged-particle beam emitted by said source, and
said plurality of driving elements include:
a deflector for deflecting the charged-particle beam;
an irradiation controller for controlling irradiation of the charged-particle beam to the object; and
an astigmatism correction unit for correcting astigmatism of said electrooptic system.

10. The apparatus according to claim 1, wherein said plurality of driving data memories include an irradiation control data memory for storing a driving data string as irradiation control data for driving said driving elements for controlling irradiation of the charged-particle beam,
said irradiation control data memory includes a plurality of unit region data memories for storing irradiation control data necessary for drawing in respective unit regions of the object, and
the plurality of operation command data strings stored in said clock pattern memory include an operation command data string for sequentially selecting said plurality of unit region data memories.

11. The apparatus according to claim 1, wherein the apparatus further comprises a source for generating a plurality of charged-particle beams, and draws a pattern on the object using the plurality of charged-particle beams.

12. A device manufacturing method comprising the steps of:
applying a resist film to a substrate;
drawing a pattern on the substrate using a charged-particle beam exposure apparatus; and
performing developing processing to the substrate,
wherein the charged-particle beam exposure apparatus draws a pattern using a charged-particle beam on the substrate, and includes:
a plurality of driving elements for drawing the pattern on the substrate while scanning the substrate with the charged-particle beam;

a plurality of driving data memories for storing a plurality of time-series driving data strings for respectively driving the plurality of driving elements; and a clock pattern memory for storing a plurality of operation command data strings obtained by aligning operation commands and the non-operation commands in time-series, the operation commands and non-operation commands constituting each operation command data string being sequentially supplied to a corresponding driving data memory of the plurality of driving data memories, wherein each of the plurality of driving data memory sequentially supplies data constituting the time-series driving data string to a corresponding driving element of the plurality of driving elements in accordance with the operation commands supplied by the clock pattern memory.

13. An exposure apparatus comprising:

first and second driving elements that control a charged-particle beam from a charged-particle beam source; and a controller that sequentially outputs commands of a first command string to the first driving element and sequentially outputs commands of a second command string to the second driving element while synchronizing the commands of the first command string and the commands of the second command string so as to control the first and second driving elements, the first command string being constituted by alignment of operation commands and non-operation commands for the first driving element and the second command string being constituted by alignment of operation commands and non-operation commands for the second driving element, wherein the controller is arranged to change a time interval between beginning of driving the first driving element and beginning of driving the second driving element, in accordance with a change in a time required to settle the charged-particle beam by the first driving element.

14. The apparatus according to claim 13, wherein the controller includes a switch for switching synchronization timing for outputting the commands of the first command string and the commands of the second command string.

15. The apparatus according to claim 13, wherein the first driving element is a deflector for deflecting the charged-particle beam and the second driving element is a blanking electrode for blanking the charged-particle beam.

16. The apparatus according to claim 13, wherein the apparatus further comprises a projection lens through which the charged-particle beam passes toward a work, and the first driving element or the second driving element is one of a focus coil for adjusting an imaging position of the projection lens, a magnification correction coil for adjusting a magnification of the projection lens, an astigmatism correction coil for correcting an astigmatism, and an MOL correction coil driven such that the projection lens satisfies MOL conditions.

17. The apparatus according to claim 13, wherein the first driving element or the second driving element is one of a deflector for deflecting the charged-particle beam, a blanking electrode for blanking the charged-particle beam, and a CLA unit for generating a plurality of intermediate images from the charged-particle beam.

18. A device manufacturing method comprising the steps of:

exposing a sample by using the exposure apparatus defined in claim 13; and developing the exposed sample.

19. An exposure apparatus comprising:

first and second driving elements that control a charged-particle beam from a charged-particle beam source; and a controller that sequentially outputs commands of a first command string and commands of a second command string to the first driving element and the second driving element, respectively, while synchronizing the commands of the first command string and the commands of the second command string, so as to control the first and second driving elements, the first command string being constituted by alignment of operation commands and non-operation commands for the first driving element and the second command string being constituted by alignment of operation commands and non-operation commands for the second driving element, wherein the controller is arranged to change a time interval between beginning of driving the first driving element and beginning of driving the second driving element, in accordance with a change in a settling time for the first driving element.

20. The apparatus according to claim 19, wherein the controller includes a switch for switching synchronization timing for outputting the commands of the first command string and the commands of the second command string.

21. The apparatus according to claim 19, wherein the apparatus further comprises a projection lens through which the charged-particle beam passes toward a work, and the first driving element or the second driving element is one of a focus coil for adjusting an imaging position of the projection lens, a magnification correction coil for adjusting a magnification of the projection lens, an astigmatism correction coil for correcting an astigmatism, and an MOL correction coil driven such that the projection lens satisfies MOL conditions.

22. The apparatus according to claim 19, wherein the first driving element or the second driving element is one of a deflector for deflecting the charged-particle beam, a blanking electrode for blanking the charged-particle beam, and a CLA unit for generating a plurality of intermediate images from the charged-particle beam.

23. A device manufacturing method comprising the steps of:

exposing a sample with the exposure apparatus defined in claim 19; and developing the exposed sample.

24. An exposure apparatus, comprising:

first, second and third driving elements that control a charged-particle beam from a charged-particle beam source; and a controller that outputs commands of command strings in time-series to the first, second and third driving elements, respectively, so as to control the first, second and third driving elements, each of the command strings being constituted by alignment of operation commands and non-operation commands, wherein the controller is arranged to change a first time interval between beginning of driving the first driving element and beginning of driving the second driving element and a second time interval between beginning of driving the first driving element and beginning of driving the third driving element.

25. A device manufacturing method comprising the steps of:

exposing a sample with the exposure apparatus defined in claim 24; and developing the exposed sample.

* * * * *

UNITED STATES PATENT AND TRADEMARK OFFICE
CERTIFICATE OF CORRECTION

PATENT NO.     : 6,777,697 B2
DATED          : August 17, 2004
INVENTOR(S)    : Yoshikiyo Yui et al.

It is certified that error appears in the above-identified patent and that said Letters Patent is hereby corrected as shown below:

Column 7,
Line 53, "symmetrical" should read -- symmetrically --.

Column 11,
Line 54, "denote" should read -- denotes --.

Column 17,
Line 58, "chock," should read -- clock, --.

Column 21,
Line 48, "memory" should read -- memories --.
Lines 55, 58 and 61, "include" should read -- includes --.

Signed and Sealed this

Twenty-sixth Day of July, 2005

JON W. DUDAS
*Director of the United States Patent and Trademark Office*